United States Patent
Midorikawa

(10) Patent No.: US 7,842,189 B2
(45) Date of Patent: Nov. 30, 2010

(54) TREATMENT DEVICE, TREATMENT DEVICE CONSUMABLE PARTS MANAGEMENT METHOD, TREATMENT SYSTEM, AND TREATMENT SYSTEM CONSUMABLE PARTS MANAGEMENT METHOD

(75) Inventor: Ryotaro Midorikawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 698 days.

(21) Appl. No.: 11/908,608

(22) PCT Filed: Jan. 19, 2006

(86) PCT No.: PCT/JP2006/300704
§ 371 (c)(1), (2), (4) Date: Sep. 14, 2007

(87) PCT Pub. No.: WO2006/098081
PCT Pub. Date: Sep. 21, 2006

(65) Prior Publication Data
US 2009/0078196 A1    Mar. 26, 2009

(30) Foreign Application Priority Data
Mar. 14, 2005    (JP) .............................. 2005-070537

(51) Int. Cl.
G01R 31/00    (2006.01)
C03C 25/68    (2006.01)
G05B 21/00    (2006.01)

(52) U.S. Cl. ............................ 216/59; 216/84; 700/266

(58) Field of Classification Search ................... 216/59; 118/108, 712
See application file for complete search history.

(56) References Cited

FOREIGN PATENT DOCUMENTS

| JP | 06 260298 | 9/1994 |
|----|-----------|--------|
| JP | 11 057386 | 3/1999 |
| JP | 11 121194 | 4/1999 |
| JP | 03 003437 | 1/2003 |
| JP | 2003 031456 | 1/2003 |

*Primary Examiner*—Binh X Tran
*Assistant Examiner*—Patti Lin
(74) *Attorney, Agent, or Firm*—Oblon, Spivak, McClelland, Maier & Neustadt, L.L.P.

(57) ABSTRACT

A processing apparatus includes counters each used to measure the length of RF discharge time over which power is applied to a consumable component in correspondence to a specific type of processing executed in a processing chamber, a storage to store wear coefficient information indicating wear coefficients each corresponding to one of the plurality of types of processing, and a control unit that obtains information indicating RF discharge time lengths measured by the counters in correspondence to the individual types of processing, obtains the wear coefficients corresponding to the individual types of processing indicated in the wear coefficient information stored in the storage, calculates a wear index value for the consumable component based upon the RF discharge time lengths and the wear coefficients corresponding to the individual types of processing, and executes consumable component management processing based upon the calculated wear index value.

32 Claims, 17 Drawing Sheets

FIG.3

| PROCESSING TYPE | PROCESSING CONDITIONS ||||||| 
|---|---|---|---|---|---|---|---|
| | PRESSURE (mTorr) | FIRST HIGH-FREQUENCY POWER (W) | SECOND HIGH-FREQUENCY POWER (W) | DISTANCE BETWEEN ELECTRODES (mm) | PROCESSING GAS (sccm) | HEAT TRANSFER GAS PRESSURE CENTER/EDGE (T) | TEMP. (°C) |
| FIRST PROCESSING | 15 | 1550 | 2170 | 25 | $C_5F_8/Ar/O_2$ =15/400/24 | 5/25 | 20 |
| SECOND PROCESSING | 30 | 1350 | 1530 | 30 | $C_5F_8/Ar/O_2$ =16/800/20 | 5/10 | 40 |
| ... | ... | ... | ... | ... | ... | ... | ... |

| PROCESSING TYPE | WEAR COEFFICIENTS OF INDIVIDUAL CONSUMABLE COMPONENTS (mm/ 100 hours) | | | |
| --- | --- | --- | --- | --- |
| | ELECTRODE PLATE AT UPPER ELECTRODE | SHIELD RING | FOCUS RING | COVER RING |
| FIRST PROCESSING | 0.183 | 1.667 | 0.522 | 1.399 |
| SECOND PROCESSING | 0.099 | 1.083 | 0.309 | 1.384 |
| ... | ... | ... | ... | ... |

FIG.5

| CONSUMABLE COMPONENT | TYPE | EXECUTION SELECTION | WEAR INDEX | ACCEPTABLE LIMIT VALUE | |
|---|---|---|---|---|---|
| | | | | LEVEL 1 | LEVEL 2 |
| ELECTRODE PLATE AT UPPER ELECTRODE | RF DISCHARGE TIME | INACTIVE | xxx | xxx | xxx |
| SHIELD RING | RF DISCHARGE TIME | INACTIVE | xxx | xxx | xxx |
| FOCUS RING | RF DISCHARGE TIME | INACTIVE | xxx | xxx | xxx |
| COVER RING | RF DISCHARGE TIME | INACTIVE | xxx | xxx | xxx |
| ... | ... | ... | ... | ... | ... |

| CONSUMABLE COMPONENT TYPE | MANUFACTURER | MODEL NUMBER | PRICE | SELECTION CRITERION 414 |
|---|---|---|---|---|
| ELECTRODE PLATE AT UPPER ELECTRODE | OO Co. Ltd. | xxx | xxx | PRICE |
| | □ Inc. | xxx | xxx | |
| | ... | ... | ... | |
| | ... | ... | ... | MANUFACTURER OO Co. Ltd. |
| SHIELD RING | ... | ... | ... | ... |

FIG.14

| CONSUMABLE COMPONENT TYPE | REPLACEMENT PROCEDURE | | | |
|---|---|---|---|---|
| | 1) OPEN COVER AND DISENGAGE UPPER ELECTRODE | 2) REPLACE ELECTRODE PLATE | | |
| ELECTRODE PLATE AT UPPER ELECTRODE | | | ... | ... |
| SHIELD RING | | | | |
| ... | | | | |

416

TREATMENT DEVICE, TREATMENT DEVICE CONSUMABLE PARTS MANAGEMENT METHOD, TREATMENT SYSTEM, AND TREATMENT SYSTEM CONSUMABLE PARTS MANAGEMENT METHOD

TECHNICAL FIELD

The present invention relates to a processing apparatus for which consumable components disposed inside a processing chamber thereof are managed, a consumable component management method to be adopted in a processing apparatus, a processing system and a consumable component management method to be adopted in a processing system.

BACKGROUND ART

A processing apparatus such as a plasma processing apparatus includes a processing chamber where a processing target substrate such as a semiconductor wafer or a liquid crystal substrate is processed. The components disposed within the processing chamber include consumable components that become gradually worn as the processing apparatus is repeatedly engaged in operation to execute various types of processing under specific processing conditions (based upon a process recipe, a cleaning recipe and the like) within the processing chamber. For instance, such consumable components in a plasma processing apparatus include a shield ring, a focus ring and the like disposed around the area where the processing target substrate is placed as well as an electrode plate of an upper electrode to which high-frequency power is applied. The processing characteristics with which a semiconductor wafer or the like is processed may be affected when such consumable components become worn to certain extents. For this reason, the consumable components need to be replaced with specific timing.

A consumable component becomes worn substantially in proportion to its utilization status (e.g., the length of time over which it has been utilized or the number of times it has been utilized). Accordingly, the extent of wear of the consumable component is estimated in the related art based upon a cumulative value representing the utilization status of the consumable component. For instance, the extent of wear of the consumable component is estimated based upon the length of time over which high-frequency power has been discharged to be applied to the electrode plate (RF discharge time) measured as the utilization time, i.e., the time over which the consumable component has been utilized, and once the RF discharge time exceeds a predetermined threshold value, an alarm is generated automatically or a consumable component replacement instruction is automatically issued so as to achieve optimal consumable component management (see, for instance, patent reference literatures 1 and 2).

(Patent reference literature 1) Japanese Laid Open Patent Publication No. H11-121194

(Patent reference literature 2) Japanese Laid Open Patent Publication No. 2003-031456

DISCLOSURE OF THE INVENTION

A plurality of types of processing may be executed under different processing conditions inside a single processing chamber in a processing apparatus such as that described above. For instance, assuming that processing such as etching is executed in the processing chamber, different processing conditions (e.g., the level and frequency of the high-frequency power applied to the electrode plate, the processing chamber internal pressure, the type and flow rate of the processing gas) are selected in correspondence to the various types of processing executed on semiconductor wafers.

However, the rate at which the consumable components become worn under given processing conditions is different from the rate at which they become worn under different processing conditions. Thus, there arises a concern that when a plurality of types of processing are executed under varying processing conditions in a single processing chamber, the consumable component wear extent change rate changes in correspondence to the ratio at which the various types of processing are executed.

For this reason, the consumable component wear extent cannot be estimated accurately simply by monitoring the consumable components based upon the RF discharge time measurement, since the change in the consumable component wear extent attributable to a diversity of types of processing executed in the processing chamber is not factored in.

For instance, if the execution ratio of processing during which the consumable components become worn quickly is greater relative to the execution ratio of processing during which the consumable components become worn more slowly, the actual wear extent is bound to be greater than the estimated wear extent calculated based upon the RF discharge time. As a result, a consumable component may become totally worn earlier than estimated before a consumable component replacement instruction is issued. In such a case, the processing characteristics with which processing target substrates are processed will be adversely affected.

In contrast, if the execution ratio of processing during which the consumable components become worn slowly is greater relative to the execution ratio of processing during which the consumable components become worn quickly, the estimated wear extent calculated based upon the RF discharge time will be greater than the actual wear extent. In such a case, a consumable component replacement instruction may be issued for a consumable component that has not become worn to an extent requiring replacement. Under these circumstances, the consumable component management cannot be optimized.

An object of the present invention, having been completed by addressing the issues of the related art discussed above, is to provide a processing apparatus, a consumable component management method to be adopted in a processing apparatus, a processing system and a consumable component management method to be adopted in a processing system, with which extents of wear of consumable components can be estimated accurately and the optimal timing for consumable component replacement can be indicated even when a plurality of types of processing are executed under different processing conditions and execution ratios of the various types of processing do not remain constant.

The object described above is achieved in an aspect of the present invention by providing a processing apparatus capable of executing a plurality of types of processing (e.g., processing on a processing target substrate) under different processing conditions inside a processing chamber in which consumable components are disposed, comprising a measuring means for measuring a utilization status of a consumable component in correspondence to each type of processing executed in the processing chamber, a storage means for storing wear coefficient information indicating wear coefficients each corresponding to a specific type of processing executed in the processing chamber and a control unit that obtains utilization statuses corresponding to the individual types of processing, having been measured by the measuring means, obtains the wear coefficients corresponding to the individual types of processing indicated in the wear coefficient information stored in the storage means, calculates a wear index for the consumable component based upon the utilization statuses corresponding to the individual types of processing and the wear coefficients corresponding to the individual types of processing and executes management processing to manage the consumable component based upon the calculated wear index.

The object described above is also achieved in another aspect of the present invention by providing a consumable component management method to be adopted in a processing apparatus capable of executing a plurality of types of processing (e.g., processing on a processing target substrate) under different processing conditions inside a processing chamber in which consumable components are disposed, comprising a step in which a measuring means is engaged to measure a utilization status of a consumable component in correspondence to each type of processing executed in the processing chamber and a step in which utilization statuses corresponding to the individual types of processing, having been measured by the measuring means, are obtained, wear coefficients each corresponding to a specific type of processing executed in the processing chamber, indicated in wear coefficient information for the consumable component stored in a storage means, are obtained, a wear index is calculated for the consumable component based upon the utilization statuses corresponding to the individual types of processing and the wear coefficients corresponding to the individual types of processing and the consumable component is managed based upon the calculated wear index.

According to the present invention disclosing the apparatus and the method described above, the wear index is calculated for the consumable component based upon the utilization statuses corresponding to the various types of processing and the wear coefficients corresponding to the various types of processing and thus, the consumable component wear index thus calculated reflects the execution ratios of the various types of processing. As a result, even when various types of processing are executed under different processing conditions inside the processing chamber and the execution ratios of the individual types of processing do not remain constant, the extent to which the consumable component becomes worn can be estimated accurately and the optimal consumable component replacement timing can be indicated. Consequently, the consumable component replacement instruction is issued in a timely manner before the consumable component becomes worn to an extent at which processing target substrate processing characteristics are adversely affected. At the same time, the optimal consumable component management is assured, since the consumable component replacement instruction is never issued prematurely before the consumable component actually becomes worn to an extent requiring replacement.

In the apparatus or the method described above, the utilization status of the consumable component may be a utilization time indicating the length of time over which the consumable component has been utilized and the consumable component wear index may be calculated as the sum of products each obtained by multiplying the utilization time corresponding to a given type of processing by the wear coefficient corresponding to the same type of processing. In this case, the utilization time of the consumable component may be, for instance, a high-frequency power discharge time indicating a length of time over which high-frequency power has been discharged to be applied to an electrode plate disposed inside the processing chamber. Alternatively, the utilization status of the consumable component measured in the apparatus or through the method may be a utilization frequency indicating the number of times the consumable component has been utilized and, in this case, the consumable component wear index may be calculated as the sum of products each obtained by multiplying the utilization frequency corresponding to a given type of processing by the wear coefficient corresponding to the same type of processing.

Since the utilization status of the consumable component is ascertained based upon the utilization time over which the consumable component has been utilized or the utilization frequency indicating the number of times the consumable component has been utilized in correspondence to each type of processing executed in the processing chamber as described above, the consumable component utilization status can be measured via the measuring means adopting a simple structure, e.g., a measuring means constituted with counters each disposed in correspondence to a specific type of processing executed in the processing chamber.

The management processing executed in the apparatus or through the method to manage the consumable components may include processing for comparing a value calculated as the consumable component wear index with a predetermined acceptable limit value and indicating replacement timing for the consumable component once the calculated consumable component wear index value becomes equal to or greater than the acceptable limit value. Through such processing, the operator can be notified of the optimal consumable component replacement timing.

The processing for indicating the consumable component replacement timing may include processing through which information indicating the consumable component replacement timing and information on the consumable component for which the replacement timing is indicated are displayed at a display means and processing through which, if there are a plurality of consumable components with consumable component wear index values thereof having been calculated equal to or greater than the acceptable limit value, a decision is made based upon consumable component combination information set in advance as to whether or not there is a combination of at least two consumable components that can be replaced at once among the plurality of consumable components and if such a combination of consumable components is determined to exist, information indicating the consumable component combination is displayed at the display means.

Since the consumable component replacement timing and the information on the consumable component to be replaced are displayed at the display means, the operator is able to ascertain with ease the exact consumable component that needs to be replaced. As a result, the efficiency of consumable component replacement is improved. In addition, when there are a plurality of consumable components that need to be replaced, a combination of consumable components that can be replaced all at once is indicated so as to further improve the efficiency of the consumable component replacement.

The consumable component management processing executed in the apparatus or through the method described above may further include processing through which a decision is made as to whether or not the consumable component has been replaced and if the consumable component is determined to have been replaced, the utilization statuses having been measured for the consumable component by the measuring means are reset. Since the consumable component utilization statuses are automatically reset following a consumable component replacement without requiring the operator to reset the consumable component utilization statuses at the time of the consumable component replacement, a potential operator error of failing to reset the utilization statuses is no longer a concern and the operational onus on the operator is reduced.

It is desirable that the consumable component management processing including calculation of the wear index for the consumable component, executed in the apparatus or through the method, be executed while the processing apparatus is engaged in operation. By executing the consumable component management processing while the processing is engaged in operation, the consumable component replacement timing can be indicated in a timely manner while the processing apparatus is engaged in operation.

The object described above is achieved in yet another aspect of the present invention by providing a processing system that includes at least one processing apparatus capable of exchanging information with an external apparatus (e.g., a host apparatus) and executing a plurality of types of processing under different processing conditions within a processing chamber, in which consumable components are disposed. The processing apparatus comprises a measuring means for measuring a utilization status of a consumable component in correspondence to each type of processing executed in the processing chamber and a control unit that obtains utilization statuses corresponding to the individual types of processing, having been measured by the measuring means, obtains wear coefficients corresponding to the individual types of processing from the external apparatus, calculates a wear index for the consumable component based upon the utilization statuses corresponding to the individual types of processing and the wear coefficients corresponding to the individual types of processing and executes management processing to manage the consumable component based upon the calculated wear index.

The object described above is further achieved in another aspect of the present invention by providing a consumable component management method to be adopted in a processing system that includes at least one processing apparatus capable of exchanging information with an external apparatus (e.g., a host apparatus), and executing a plurality of types of processing under different processing conditions inside a processing chamber in which consumable components are disposed. The consumable component management method comprises a step in which a measuring means is engaged to measure a utilization status of a consumable component in correspondence to each type of processing executed in the processing chamber and a step in which utilization statuses corresponding to the individual types of processing, having been measured by the measuring means, are obtained, wear coefficients each corresponding to a specific type of processing executed in the processing chamber, indicated in wear coefficient information for the consumable component stored in a storage means, are obtained, a wear index is calculated for the consumable component based upon the utilization statuses corresponding to the individual types of processing and the wear coefficients corresponding to the individual types of processing and the consumable component is managed based upon the calculated wear index.

According to the present invention disclosing the system and the method described above, the wear index is calculated for the consumable component based upon the utilization statuses corresponding to the various types of processing and the wear coefficients corresponding to the various types of processing and thus, the consumable component wear index thus calculated reflects the execution ratios of the various types of processing. As a result, even when various types of processing are executed under different processing conditions inside the processing chamber and the execution ratios of the individual types of processing do not remain constant, the extent to which the consumable component becomes worn can be estimated accurately and the optimal consumable component replacement timing can be indicated. In addition, the wear coefficient information for the consumable components is obtained from the external apparatus and thus, the processing apparatus does not need to store the wear coefficient information. As a result, the onus placed on the processing apparatus is reduced.

In the system or the method described above, the utilization status of the consumable component may be a utilization time indicating the length of time over which the consumable component has been utilized and the control unit may calculate the consumable component wear index as the sum of products each obtained by multiplying the utilization time corresponding to a given type of processing by the wear coefficient corresponding to the same type of processing. Alternatively, the utilization status of the consumable component may be the utilization frequency indicating the number of times the consumable component has been utilized and the control unit may calculate the wear index for the consumable component as the sum of products each obtained by multiplying the utilization frequency corresponding to a given type of processing by the wear coefficient corresponding to the same type of processing.

Since the utilization status of the consumable component is ascertained based upon the utilization time over which the consumable component has been utilized or the utilization frequency indicating the number of times the consumable component has been utilized in correspondence to each type of processing executed in the processing chamber as described above, the consumable component utilization status can be measured via the measuring means adopting a simple structure, e.g., a measuring means constituted with counters each disposed in correspondence to a specific type of processing executed in the processing chamber.

Management processing executed in the system or through the method to manage the consumable components may include processing for comparing a value calculated as the consumable component wear index with a predetermined acceptable limit value and indicating replacement timing for the consumable component once the calculated consumable component wear index value becomes equal to or greater than the acceptable limit value. Through such processing, the operator can be notified of the optimal consumable component replacement timing.

The processing for indicating the consumable component replacement timing may include processing through which information indicating the consumable component replacement timing and information on the consumable component for which the replacement timing is indicated are displayed at a display means and processing through which information indicating a candidate a consumable component selected to be used as a consumable component replacement based upon a preset selection criterion is obtained from the external apparatus and the candidate consumable component information is displayed at the display means. The processing may instead include processing through which replacement procedure information indicating a procedure to be followed when replacing the consumable component with a replacement is obtained from the external apparatus and the replacement procedure information is displayed at the display means. Through the processing described above, the correct candidate consumable component can be selected and the replacement routine can be performed with ease even by an operator without expert knowledge on consumable component replacement operation.

It is to be noted that the description in the specification is provided by assuming that 1 mTorr=$(10^{-3} \times 101325/76)$ Pa and that 1 sccm=$(10^{-6}/60)$ (m$^3$/sec).

According to the present invention, the wear extent of a consumable component can be accurately estimated and the optimal consumable component replacement timing can be indicated even when a plurality of types of processing are executed under different processing conditions and the execution ratios of the various types of processing do not remain constant.

BRIEF DESCRIPTION OF THE DRAWINGS

FIG. 3 presents a specific example of the processing type information data table in FIG. 2;

FIG. 4 presents a specific example of the wear coefficient information data table in FIG. 2;

FIG. 5 presents a specific example of the acceptable wear index limit information data table in FIG. 2;

FIG. 13 presents a specific example of the consumable component selection information data table used in the embodiment;

FIG. 14 presents a specific example of the consumable component replacement procedure information data table used in the embodiment;

Figure 1:
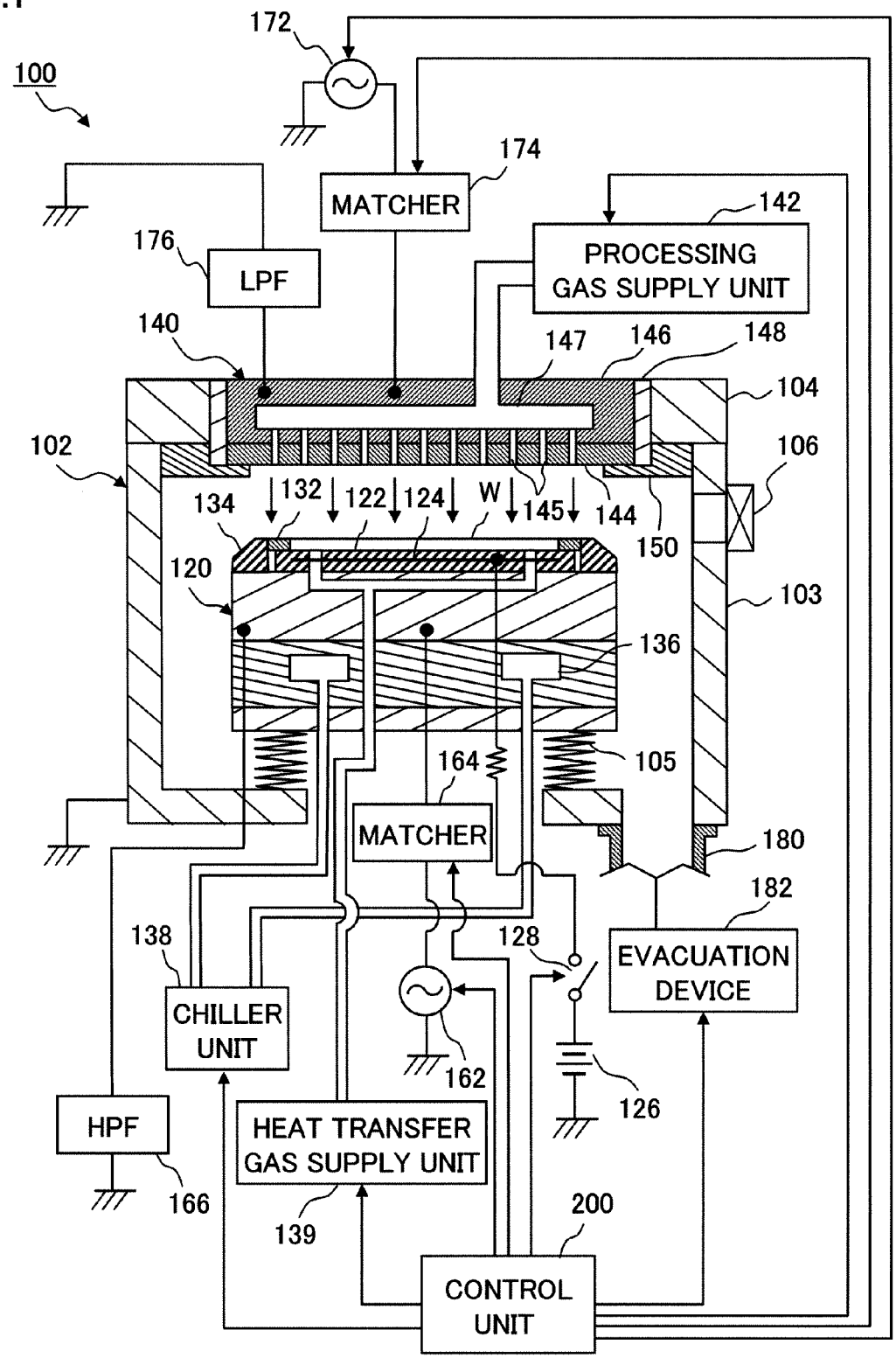
FIG. 1 is a sectional view presenting a structural example that may be adopted in the substrate processing apparatus achieved in a first embodiment of the present invention.

EXPLANATION OF REFERENCE NUMERALS 100, 300 substrate processing apparatus
102 processing chamber
103 container body
104 cover
105 bellows
106 gate valve
120 lower electrode
122 electrostatic chuck
124 electrostatic chuck electrode
126 DC power source
128 switch
132 focus ring
134 cover ring
136 coolant chamber
138 chiller unit
139 heat transfer gas supply unit
140 upper electrode
142 processing gas supply unit
144 electrode plate
145 gas passing hole
146 electrode support member
147 buffer chamber
148 insulating member
150 shield ring
162 first high frequency power source
164 matcher
166 high pass filter (HPF)
172 second high-frequency power source
174 matcher
176 low pass filter (LPF)
180 exhaust port
182 exhaust device
200 control unit
210 CPU
220 ROM
230 RAM
240 display means
250 input/output means
260 alerting means
270 various controllers
280 counters
290 storage means
292 processing type information
294 wear coefficient information
296 acceptable wear index limit information
300 substrate processing apparatus
302 holding unit
304 baffle plate
310 magnets
312 upper magnet
314 lower magnet
320 shield plate
400 substrate processing system
410 host apparatus
412 wear coefficient information
414 consumable component selection information
416 consumable component replacement procedure information
420A, 420B terminal
100A, 100B substrate processing apparatus
200A, 200B control unit
W wafer

MODE FOR CARRYING OUT THE INVENTION

The following is a detailed explanation of the preferred embodiments of the present invention, given in reference to the attached drawings. It is to be noted that in the specification and the drawings, the same reference numerals are assigned to structural components having substantially identical functions and structural features so as to preclude the necessity for a repeated explanation thereof.

(Substrate Processing Apparatus Achieved in the First Embodiment)

First, the first embodiment achieved by adopting the processing apparatus according to the present invention in a substrate processing apparatus that processes processing target substrates is explained in reference to drawings. FIG. 1 is a sectional view presenting a structural example that may be adopted in the substrate processing apparatus achieved in the embodiment. A substrate processing apparatus 100 shown in FIG. 1 is a plasma processing apparatus having an upper electrode and a lower electrode disposed so as to face opposite each other, to both of which high-frequency power is applied.

As shown in FIG. 1, the substrate processing apparatus 100 includes a processing chamber (chamber) 102 constituted of an electrically conductive material such as aluminum. The processing chamber 102 is constituted with a processing container that includes a container body 103 with, for instance, an open top and a cover (lid) 104 that closes off the opening of the container body 103. The cover 104 is detachably mounted at the container body 103 with a fastening member such as a bolt by assuring air tightness. In addition, a seal member (not shown) such as an O-ring is disposed between the cover 104 and the container body 103. Thus, an even higher level of airtightness is assured over the area between the cover 104 and the container body 103. It is to be noted that the processing chamber 102 is grounded for safety.

Inside the processing chamber 102, a disk-shaped lower electrode (susceptor) 102, also functioning as a stage on which a processing target substrate such as a semiconductor wafer (hereafter may be simply referred to as a "wafer") W is placed, and an upper electrode 140, facing opposite the lower electrode 120 and also functioning as a showerhead through which a processing gas, a purge gas or the like is delivered, are disposed.

A first high-frequency power source 162 is connected to the lower electrode 120 via a matcher 164, whereas a second high-frequency power source 172 that provides power with a frequency higher than that of the power provided from the first high-frequency power source 162 is connected to the upper electrode 140 via a matcher 174. In addition, a high pass filter (HPF) 166 that filters the high-frequency current originating from the second high-frequency power source 172 to flow into the lower electrode 120 is connected to the lower electrode 120, whereas a low pass filter (LPF) 176 that filters the high-frequency current originating from the first high-frequency power source 162 to flow into the upper electrode 140 is connected to the upper electrode 140.

A processing gas supply unit 142 that supplies a gas to be used in the processing executed in the processing chamber 102 is connected to the upper electrode 140 via a gas delivery pipe. The processing gas supply unit 142 is constituted with a gas supply source from which a processing gas used to process a wafer inside the processing chamber 102, a purge gas used to clean the inside of the processing chamber 102 or the like is supplied and a valve and a mass flow controller with which the gas delivery from the gas supply source is controlled.

In addition, an exhaust port 180 is present at the bottom surface of the processing chamber 102. An exhaust device 182 that evacuates the processing chamber 102 is connected to the exhaust port 180 via a discharge pipe. The exhaust device 182, which may include, for instance, a vacuum pump, is capable of depressurizing the atmosphere inside the processing chamber 102 so as to achieve a predetermined degree of vacuum therein.

When executing processing such as etching on a wafer W placed inside the processing chamber 102 of this substrate processing apparatus 100, a specific type of processing gas is delivered into the processing chamber 102 from the processing gas supply unit 142 and the processing chamber 102 is evacuated by the exhaust device 182 until the predetermined degree of vacuum is achieved. Then, while sustaining the predetermined degree of vacuum, first high-frequency power with a frequency of, for instance, 2 MHz is applied from the first high-frequency power source 162 to the lower electrode 120 and second high-frequency power with a frequency of, for instance, 60 MHz is applied from the second high-frequency power source 172 to the upper electrode 140, thereby generating plasma with the processing gas in the space between the lower electrode 120 and the upper electrode 140 through the action of the second high-frequency power and also generating a self bias potential at the lower electrode 120 through the action of the first high frequency power. As a result, plasma processing such as reactive ion etching can be executed on the wafer W placed on the lower electrode 120.

An electrostatic chuck that electrostatically holds the wafer W is disposed at the lower electrode 120. The electrostatic chuck 122 may be constituted by embedding an electrostatic chuck electrode 124 constituted with a conductive film within an insulating film. The electrostatic chuck electrode 124 is electrically connected with a DC power source 126 via a switch 128. As a DC voltage is applied from the DC power source 126, the wafer W is held fast to the electrostatic chuck 122 structured as described above with Coulomb force.

A focus ring 132 is disposed at the edge of the upper surface of the electrostatic chuck 122 so as to enclose the outer edge of the wafer W. In addition, a cover ring 134 is disposed at the edge of the upper surface of the lower electrode 120 so as to surround the electrostatic chuck 122 and the focus ring 132. Via the focus ring 132 and the cover ring 134 disposed as described above, plasma is directed to the wafer W. It is to be noted that instead of constituting the focus ring 132 and the cover ring 134 as separate members, they may be formed as an integrated unit.

A cooling mechanism is disposed inside the lower electrode 120. This cooling mechanism may include a coolant chamber 136 ranging along the circumferential direction inside the lower electrode 120, through which a coolant (e.g., cooling water) at a predetermined temperature, supplied from a chiller unit 138 via a piping circulates. The processing temperature at which the wafer W on the electrostatic chuck 122 is processed can be controlled in correspondence to the coolant temperature.

In addition, a heat transfer gas (back gas) such as an He gas from a heat transfer gas supply unit 139 is supplied via a gas supply line to the area between the upper surface of the electrostatic chuck 122 and the rear surface of the wafer W through the central portion and the edge portion within the plane of the wafer W. As a result, the process of heat transfer between the lower electrode 120 and the wafer W is promoted.

A bellows 105 constituted of, for instance, aluminum, is disposed between the lower surface of the lower electrode 120 and the bottom surface of the processing chamber 102. An elevator mechanism (not shown) is disposed at the lower electrode 120 and, as the lower electrode 120 is caused to move up/down via the elevator mechanism, the distance between the lower electrode and the upper electrode 140 can be adjusted to the optimal setting in correspondence to the type of processing to be executed on the wafer W. A gate valve 106 via which a wafer transfer port is opened/closed is mounted at a side wall of the processing chamber.

The upper electrode 140, which also functions as the showerhead, includes an electrode plate 144 forming the lower surface thereof and having numerous gas passing holes 145 formed therein and an electrode support member 146 that detachably supports the electrode plate 144. The electrode plate 144 may be constituted of, for instance, silicon, whereas the electrode support member 146 may be constituted of aluminum. A buffer chamber 147 is formed inside the electrode support member 146, with the processing gas supply unit 142 mentioned earlier connected via a gas delivery pipe to a gas delivery port of the buffer chamber 147.

An insulating member 148 is mounted at the upper electrode 140 so as to surround the outer circumference thereof and thus, the upper electrode 140 and the processing chamber 102 are insulated from each other. The lower surface of the insulating member 148 and the lower surface of the electrode plate 144 are set flush to each other, and a shield ring 150 is mounted at the ends of the lower surfaces of the insulating member 148 and the electrode plate 144. The shield ring 150 may be constituted of, for instance, an inorganic oxide such as quartz or alumina. It is to be noted that the shield ring 150 does not need to be formed as a member independent of the insulating member 148, and it may instead be formed as an integrated part of the insulating member.

The substrate processing apparatus 100 includes a control unit 200 that controls the various units thereof. The control unit 200 controls the operations of, for instance, the first and second high-frequency power sources 162 and 172, the matchers 164 and 174, the processing gas supply unit 142, the exhaust device 182, the switch 128 for the electrostatic chuck 122, the chiller unit 138, the heat transfer gas supply unit 139.

Among components disposed inside the processing chamber 102 of the substrate processing apparatus 100 structured as described above, the electrode plate 144 at the upper electrode 140, the shield ring 150, the focus ring 132 and the cover ring 134 disposed at the lower electrode 120, the seal member (not shown) such as an O-ring disposed between the container body 103 and the cover 104 and the like are consumable components that become worn as wafer processing is repeatedly executed inside the processing chamber 102. If these consumable components are allowed to become worn beyond a certain extent, the processing characteristics with which the wafer W is processed in the substrate processing apparatus 100 may be adversely affected. For this reason, the consumable components need to be replaced with specific timing. Accordingly, the substrate processing apparatus 100 executes consumable component management processing so as to manage the consumable component replacement timing and the like by calculating estimated values (wear index values) each indicating the extent of wear of a given consumable component.

(Structural Example for the Control Unit)

Next, the control unit that executes the consumable component management processing described above is explained. Since the consumable component management processing is typically executed by the control unit 200, which controls the various units constituting the substrate processing apparatus 100, the following explanation is provided on a specific structural example that may be adopted in the control unit 200 in reference to FIG. 2.

Figure 2:
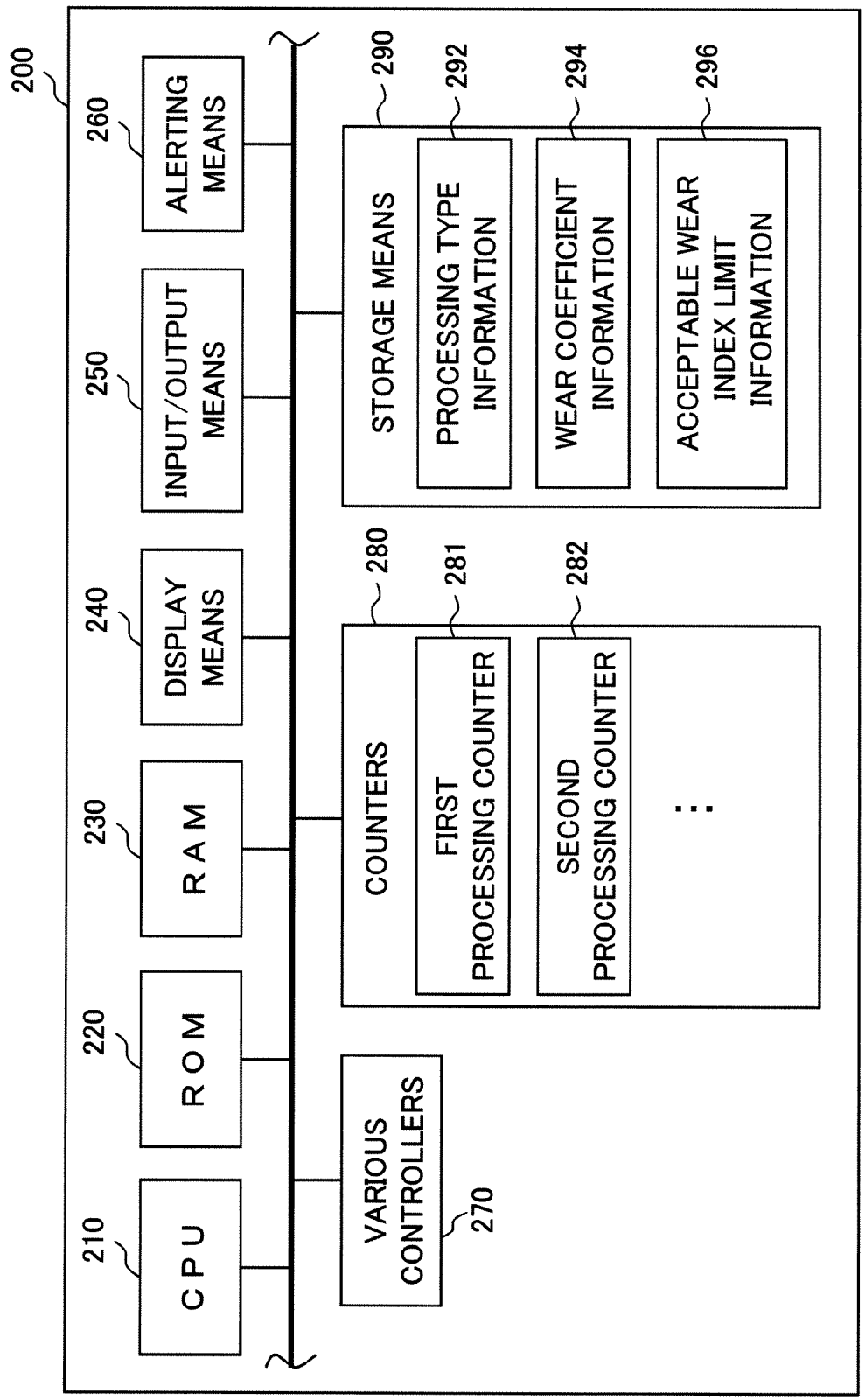
FIG. 2 is a block diagram presenting a structural example that may be adopted in the control unit in FIG. 1.

As shown in FIG. 2, the control unit 200 comprises a CPU (central processing unit) 210 constituting the control unit main body, a ROM (read only memory) 220, in which program data used by the CPU 210 when it controls the various units (e.g., program data used to execute wafer processing, cleaning processing executed to clean the inside of the processing chamber, consumable component management processing and the like) are stored, a RAM (random access memory) 230, which includes a memory area used by the CPU 210 when it executes various types of data processing, a display means 240 constituted with a liquid crystal display or the like at which an operating screen, a selection screen or the like is brought up on display, an input/output means 250 for enabling the operator to input/output various types of data and the like, an alerting means 260 constituted with, for instance, an alarm such as a buzzer, various controllers 270 engaged in operation to control various units (e.g., the first and second high-frequency power sources 162 and 172) of the substrate processing apparatus 100, counters 280 each used to measure the utilization status (e.g., the utilization time or the utilization frequency) of a consumable component and a storage means 290 constituted with, for instance, a hard disk or a memory.

The CPU 210 is electrically connected with the ROM 220, the RAM 230, the display means 240, the input/output means 250, the alerting means 260, the various controllers 270, the counters 280 and the storage means 290 via a bus line, such as a control bus, a system bus or a data bus.

The various controllers 270 include controllers engaged in control of the operations of the first and second high-frequency power sources 162 and 172, the matchers 164 and 174, the processing gas supply unit 142, the exhaust device 182, the switch 128 for the electrostatic chuck 122, the chiller unit 138, the heat transfer gas supply unit 139 and the like.

The counters 280 are each used to count the utilization status (e.g., the utilization time indicating the length of time over which the consumable component has been utilized, the utilization frequency indicating the number of times the consumable component has been utilized or the like) of a specific consumable component in correspondence to one of various types of processing, which is needed when calculating the wear index (the estimated value indicating the extent of wear) for the particular consumable component. The counters 280 in this embodiment include counters each used to count the utilization status of the consumable component in correspondence to a specific type of processing among the various types of processing executed in the processing chamber 102 of the substrate processing apparatus 100. In more specific terms, in correspondence to first processing, second processing, ... and nth processing that may be executed in the processing chamber 102, for instance, a first processing counter 281, a second processing counter 282, ... and an nth counter are provided as the counters 280. A set of counters which includes the first processing counter 281, the second processing counter 282, ... and the nth processing counter is provided in correspondence to each of the management target consumable components.

A counter 280 used to measure the utilization status of a consumable component as described above may be a cumulative consumable component utilization time counter, such as an RF discharge time counter, an operating time counter or a gas utilization counter, or it may be a cumulative consumable component utilization frequency counter such as a PM utilization frequency counter or a drive frequency counter. The RF discharge time counter counts the length of time over which high-frequency power (RF) has been discharged to be applied to an electrode (the upper electrode or the lower electrode) while executing processing in the processing chamber 102, whereas the operating time counter counts the operating time elapsing while executing processing in the processing chamber 102. The gas utilization counter counts the quantity of gas used while executing processing in the processing chamber 102. In addition, the PM utilization frequency counter may count, for instance, the number of times a wafer probing device has been utilized, whereas the drive frequency counter counts the number of times the apparatus has been driven to execute processing in the processing chamber 102.

The counters 280 used in the embodiment may be, for instance, RF discharge time counters, among the various types of counters described above, so as to measure the lengths of time over which the individual consumable components have been utilized with the RF discharge time counters. The RF discharge time counters in the embodiment each count the length of time over which the high frequency (RF) power is discharged from the first and second high-frequency power sources 162 and 172 to be applied to the upper electrode 140 and the lower electrode 120 based upon a control signal provided by the control unit 200 when executing processing in the processing chamber 102 and add the count value to the cumulative high-frequency (RF) discharge time each time processing is executed in the processing chamber 102.

In the storage means 290, processing type information 292 indicating various types of processing that may be executed in the processing chamber 102, wear coefficient information 294 indicating wear coefficients used when calculating the wear index values for the various consumable components, acceptable wear index limit information 296 indicating acceptable wear index limit values for the various consumable components and the like are stored.

A specific example of the processing type information 292 is now explained in reference to FIG. 3. The processing type information 292 may be constituted with a data table such as that shown in FIG. 3, which includes data indicating processing types, processing conditions and the like. The processing type data indicate the types of processing that may be executed in the processing chamber 102, whereas the processing condition data indicate condition settings selected to execute the individual types of processing, i.e., processing recipes such as a process recipe based upon which wafers W are processed, a cleaning recipe based upon which cleaning processing is executed to clean the inside of the processing chamber and the like). The processing type information is used in the consumable component management processing to be detailed later.

It is desirable that the processing types be determined each in correspondence to a specific wear rate at which the process of consumable component wear progresses, since the wear index is calculated for each consumable component in correspondence to the execution ratios of the various types of processing by calculating the consumable component wear index based upon the utilization statuses corresponding to the individual types of processing and the wear coefficients corresponding to the individual types of processing.

For instance, the wafer processing and the cleaning processing are executed for different processing targets, i.e., the wafer W and the inside of the processing chamber, under different processing conditions with the consumable components becoming worn at different rates. In addition, the wafer processing includes different types of processing such as etching and film formation processing executed under different processing conditions with the consumable components becoming worn at different rates, through which different processing results are achieved. Accordingly, it is desirable to classify the etching processing and the film formation processing (processing through which a film is etched and processing through which a film is formed) as different types of processing under these circumstances.

Furthermore, while processing such as etching processing is executed to achieve a single type of processing results on wafers W, the consumable components may become worn at different wear rates under different sets of processing conditions. Accordingly, the processing executed under one set of processing conditions should be classified as a different type of processing from processing executed under another set of processing conditions. However, the processing conditions may be slightly altered without affecting the consumable component wear rate and in such a case, the processing executed under the slightly altered processing conditions may be regarded as the same type of processing. A range of processing conditions, the processing executed under which is to be considered as a single type of processing, may be set as well.

Next, in reference to FIG. 4, a specific example of the wear coefficient information 294 is explained. The wear coefficient information 294 is constituted with a data table such as that shown in FIG. 4, which includes data indicating processing types and data indicating consumable component wear coefficients corresponding to the individual consumable components. The processing types indicated in the processing type data correspond to the processing types shown in FIG. 3. As the wear coefficient data for the individual consumable components, the wear coefficient of each consumable component is stored in correspondence to each type of processing. The term "wear coefficient" in this context refers to the rate of change occurring in the extent of wear of the consumable component relative to the utilization time, as observed when a given type of processing alone is continuously executed.

Values indicated as the wear coefficients in FIG. 4 have been determined based upon the results of testing conducted by continuously executing a typical first processing and second processing, i.e., HARC (high aspect ratio contact) wafer processing and SAC (self-aligned contact) wafer processing, separately from each other. The HARC wafer processing is etching processing through which a contact hole structure with a large aspect ratio (the ratio of the depth of the contact hole relative to its diameter) is formed on the wafer W. The SAC wafer processing is etching processing through which a self-aligned contact hole structure achieving higher density in wiring is formed on the wafer W by allowing connecting holes to be formed off the lower-layer wiring. The wear coefficients shown in FIG. 4 indicate that the wear coefficients assumed in correspondence to one type of processing differ from the wear coefficients assumed in correspondence to the other type of processing, although the extent of difference varies among the individual consumable components.

Accordingly, by multiplying the utilization time corresponding to each type of processing by the wear coefficient for the particular type of processing so as to calculate a wear index for the specific type of processing and then tabulating the wear index values calculated for the individual types of processing, the wear index for the consumable component for all types of processing that may be executed in the processing chamber can be calculated. As a result, even if a plurality of types of processing are executed under varying processing conditions in the processing chamber 102, accurate consumable component replacement timing can be estimated.

It is to be noted that the wear coefficients indicated in the wear coefficient information 294 can be taken in from an external source. For instance, the wear coefficients may be entered by the operator by operating the input/output means or they may be taken in from an external apparatus (e.g., a host apparatus) connected to the control unit 200 so as to enable information exchange.

In addition, the consumable component wear coefficients are not limited to those described above obtained based upon the results of testing conducted in advance by repeatedly executing the individual types of processing, and wear coefficients determined through, for instance, a statistical procedure may be used. More specifically, wear coefficients determined through regression analysis executed by applying numerous sets of operational data to the wear index may be used.

Next, in reference to FIG. 5 a specific example of the acceptable wear index limit information 296 is explained. The acceptable wear index limit information 296 is constituted with a data table such as that shown in FIG. 5, which includes consumable component data, type data, execution selection data, consumable component wear index data and acceptable limit value data. The consumable components for which the consumable component management processing is executed are stored as the consumable component data.

Data indicating a specific type of counters 280 to be utilized for wear index calculation are set as the type data. For instance, the type data may indicate a specific type of counters among those described earlier, e.g., RF discharge time counters, PM utilization frequency counters, operating time counters, drive frequency counters or gas utilization counters. The execution selection data are used to indicate the choice with regard to whether or not to execute processing based upon the wear index calculated for each consumable component, e.g., alert processing such as sounding an alarm. For instance, the execution selection data indicate "active", the alert processing may be executed by sounding an alarm and if the execution selection data indicate "inactive", the alert processing, e.g., sounding an alarm, may be suspended.

As the wear index data, the wear index calculated for each consumable component in the processing chamber 102 where a plurality of different types of processing are executed is stored. The wear index value, which is calculated through the consumable component management processing to be detailed later, may be updated each time processing is executed in the processing chamber 102. As the acceptable limit value data, acceptable wear index limit values are stored in correspondence to the individual consumable components. The acceptable limit values may be set over a plurality of stages (e.g., over two stages, limit level 1 and limit level 2). The acceptable limit values may assume any values set via the input/output means 250.

It is to be noted that in addition to the processing type information 292, the wear coefficient information 294 and the acceptable wear index limit information 296 described above, consumable component combination information indicating a combination of at least two consumable components that can be replaced at once among the various consumable components and the like are also stored in the storage means 290.

(Specific Example of the Consumable Component Management Processing)

Figure 6:
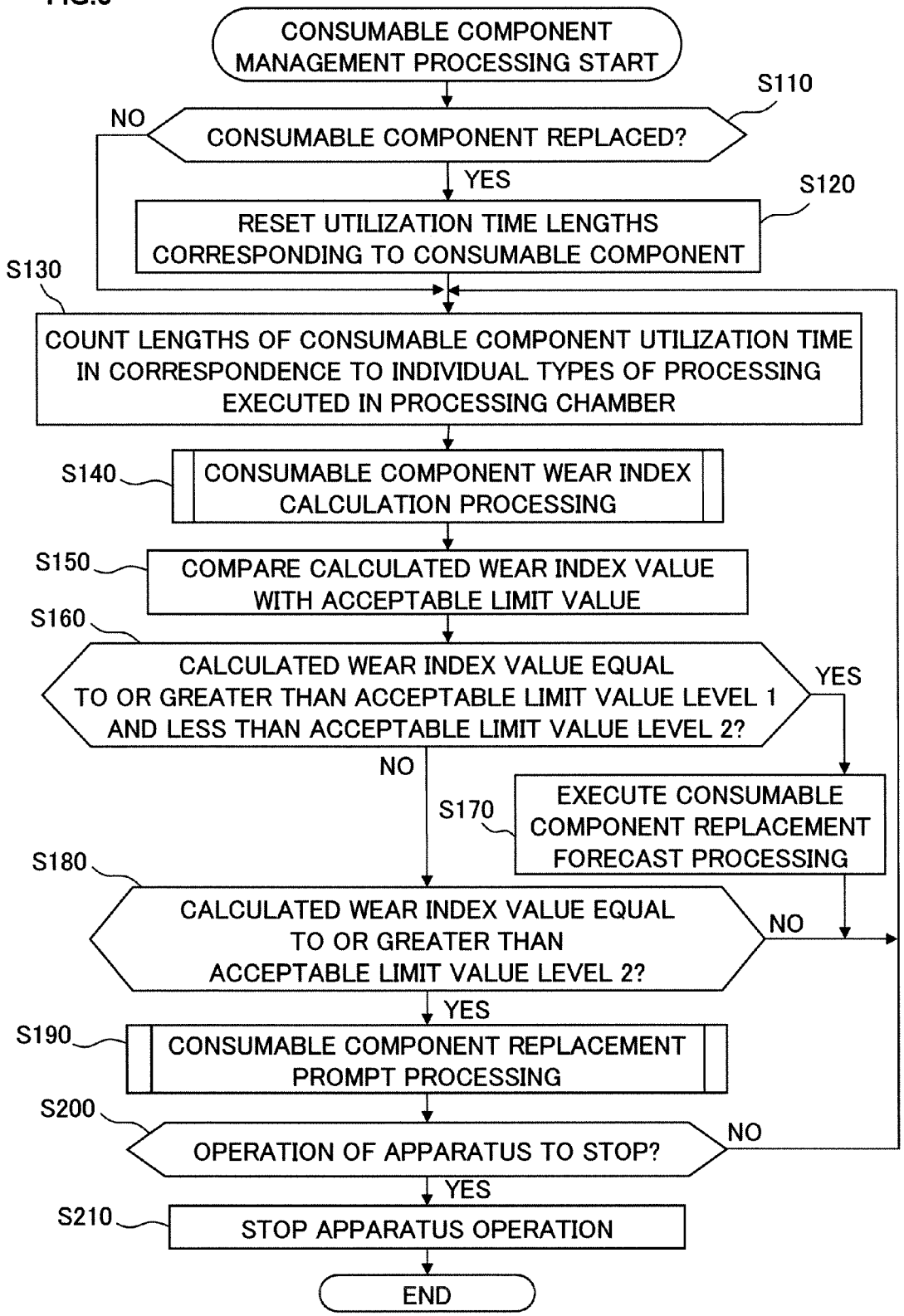
FIG. 6 presents a flowchart of a specific example of the consumable component management processing executed in the embodiment.

Next, a specific example of the consumable component management processing executed by the control unit 200 structured as described above is explained in reference to drawings. FIG. 6 presents a flowchart of the main routine of the consumable component management processing executed in the embodiment.

As the substrate processing apparatus 100 is engaged in operation, a decision is first made in step S110 as to whether or not a consumable component has been replaced in the consumable component management processing shown in FIG. 6. Upon determining that a consumable component has been replaced, the utilization time for the newly-replaced consumable component is reset in step S120. Since the RF discharge time is regarded as the utilization time of the consumable components in the embodiment, the first processing counter through the nth processing counter corresponding to the newly replaced a consumable component, among the counters 280 used to count the lengths of RF discharge time, are reset in step S120.

Thus, once a consumable component is replaced and the substrate processing apparatus 100 resumes its operation, the counters used to measure the lengths of RF utilization time for the particular consumable components are automatically reset. Since this eliminates the need for the operator to perform a specific operation to reset the consumable component utilization statuses after the consumable component replacement, any error that would result from an operator's failure to perform the reset operation is prevented and also the operational onus placed on the operator is reduced. It is to be noted that the first processing counters through the nth processing counters for the consumable components that have not been replaced, among the counters 280, are not reset.

If it is decided in step S110 that no consumable component has been replaced, the length of utilization time is counted in step S130 in correspondence to the specific type of processing to be executed in the processing chamber 130. In the embodiment, the RF discharge time is counted as the consumable component utilization time with the counters 280. In addition, the specific type of processing as referred to in this context may correspond to one of the processing types indicated in FIGS. 3 and 4.

The consumable component utilization time count processing (in step S130) may be executed as follows. Prior to the execution of processing inside the processing chamber 102, the control unit 200 judges the type of processing to be executed (e.g., the first processing or the second processing) based upon the processing type information 292 such as that shown in FIG. 3. By incorporating processing type data in the processing condition data table, as shown in FIG. 3, the type of processing to be executed can be judged concurrently as the processing conditions (processing recipe) selected for the imminent processing are taken in.

Then, as the processing is executed in the processing chamber 102 based upon the processing condition settings, the RF discharge time is counted based upon a control signal used to control the first and second high-frequency power sources 162 and 172. At this time, the RF discharge time is counted by using the counters corresponding to the type of current processing among the counters 280. For instance, the RF discharge time is counted with the first processing counters 281 each time the first processing is executed, whereas the RF discharge time is counted by using the second processing counters 282 each time the second processing is executed. By counting the RF discharge time with different counters in correspondence to the individual types of processing, count values are accumulated for each type of processing.

Next, consumable component wear index calculation processing is executed in step S140. If a plurality of consumable components are managed, wear index values are calculated for the individual consumable components.

(Specific Example of Wear Index Calculation Processing)

Figure 7:
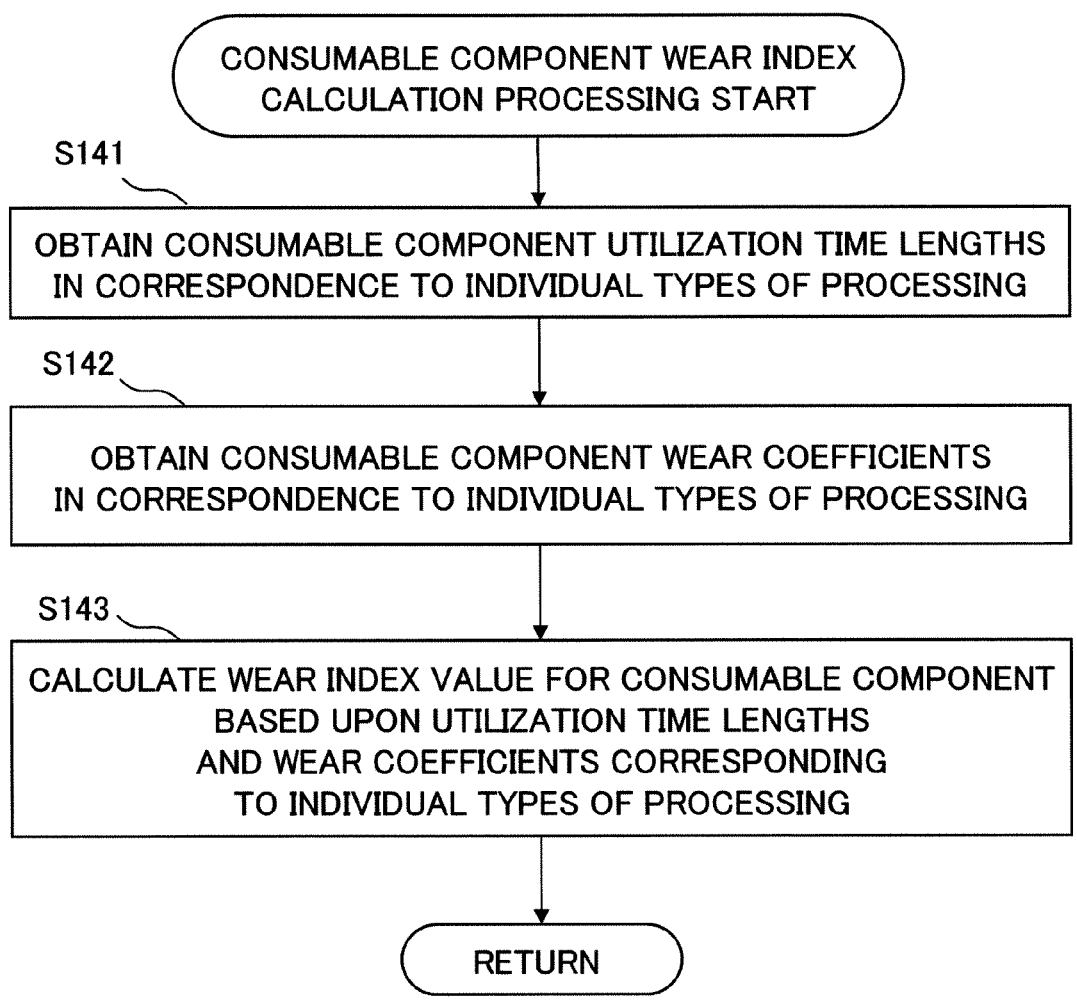
FIG. 7 presents a flowchart of a specific example of the wear index calculation processing executed to calculate the wear index for a consumable component in the embodiment.

The consumable component wear index calculation processing (step S140) may be executed through a subroutine such as that shown in FIG. 7. First, in step S141, the lengths of consumable component utilization time are obtained in correspondence to the individual types of processing. More specifically, the count values indicated at the various counters 280 (first processing counter~nth processing counter) indicating cumulative lengths of utilization time having been tallied up in correspondence to the individual types of processing are taken in.

Next, in step 142, the consumable component wear coefficients corresponding to the individual types of processing are taken in. More specifically, the wear coefficients corresponding to the individual types of processing indicated in the wear coefficient information 294 shown in FIG. 4 are taken in. For instance, if the consumable component is the electrode plate 144 at the upper electrode 140, wear coefficient 0.183 mm/100 hours, wear coefficient 0.099 mm/100 hours and the like are taken in respectively in correspondence to the first processing, the second processing and the like.

In step S143, the wear index for the consumable component is calculated based upon the utilization time lengths and the wear coefficients corresponding to the individual types of processing. The wear index of the consumable component is calculated as the sum of the products each obtained by multiplying the utilization time corresponding to a given type of processing by the wear coefficient corresponding to the same type of processing. In more specific terms, with $T_{pq}$ representing a utilization time counted for the consumable component (the count value at a counter 280) and $K_{pq}$ representing the wear coefficient of the consumable component, the wear index $Y_p$ can be calculated for the consumable component p, as expressed in 1-1 below. The subscript letter p in the wear index $Y_p$, the utilization time $T_{pq}$ and the wear coefficient $K_{pq}$ indicates the identification number assigned to the consumable components. Assuming that there are m consumable components the replacement timing of which needs to be managed, p assumes a value among 1, 2, . . . m. In addition, the subscript letter q indicates the specific type of processing executed in the processing chamber 102 and assuming that there are n types of processing executed in the processing chamber, q assumes a value among 1, 2, . . . n. It is to be noted that the wear index value thus calculated is stored in the acceptable wear index limit information 296 such as that shown in FIG. 5. The wear index value $Y_p$ may increase/decrease in steps set in correspondence to the units selected for the wear coefficient $K_{pq}$. In addition, assuming that n=1, expression (1-1) may be adopted in conjunction with a single type of processing executed continuously.

$$Y_p = K_{p1}T_{p1} + P_{p2}T_{p2} + \ldots + K_{pn}T_{pn} \tag{1-1}$$

Figure 8:
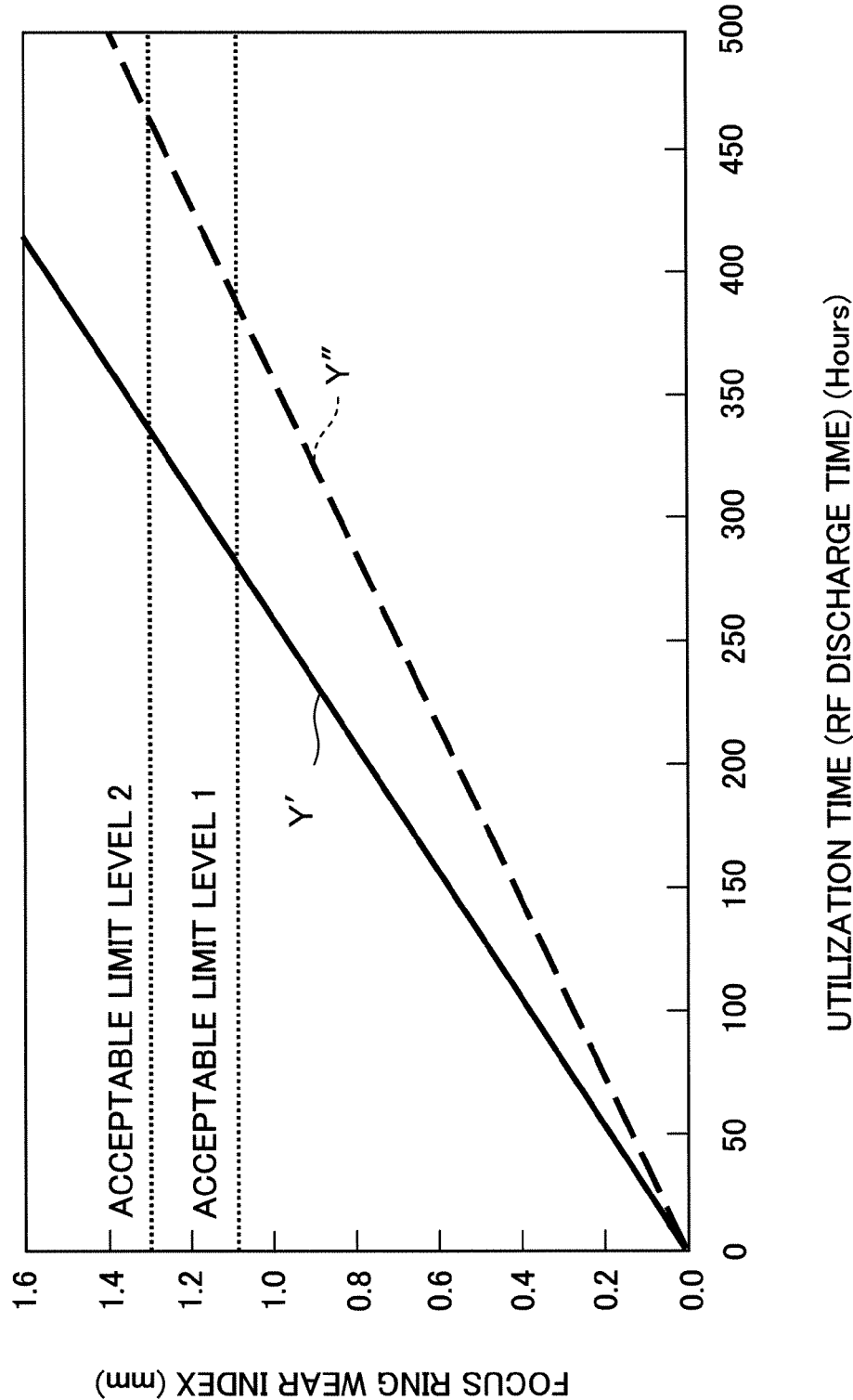
FIG. 8 presents the results of testing conducted with regard to the wear index calculated by executing the wear index calculation processing in the embodiment.

A specific example of the wear index calculated as described above for a consumable component is now explained in reference to a drawing. FIG. 8 presents a graph diagram of wear index values calculated for a consumable component, i.e., the focus ring 132, by utilizing focus rings over equal lengths of time at different processing type ratios (different ratios of the first processing and the second processing). Index plots Y' and Y" are each obtained by plotting the changes occurring in the corresponding wear index Y' or Y" over the entire span of utilization time (300 hours). The wear index plot Y' indicates the changes occurring in a focus ring utilized for 238 hours (RF discharge time) in the first processing and utilized for 62 hours (RF discharge time) in the second processing. The wear index plot Y" indicates the changes occurring in a focus ring utilized for 58.25 hours (RF discharge time) in the first processing and utilized for 241.75 hours (RF discharge time) in the second processing.

FIG. 8 indicates that even when focus rings are utilized for equal lengths of time (300 hours), their wear indices Y' and Y" change at different rates in correspondence to specific processing type ratios, since different wear coefficients are assumed in correspondence to the individual types of processing (first processing and second processing) as shown in FIG. 3. Accordingly, the wear index plot Y' corresponding to the focus ring utilized in the first processing with a greater wear coefficient over a greater length of time reaches the replacement level earlier than the wear index plot Y". In short, since the wear index is calculated in correspondence to the specific processing type ratio, the embodiment makes it possible to accurately estimate the optimal replacement timing for the consumable component.

Next, in step S150, the wear index (calculated wear index value) having been calculated as described above is compared with acceptable limit values. For instance, the calculated wear index is compared with the acceptable limit values (e.g., limit levels 1 and 2) set in the acceptable wear index limit information 296 shown in FIG. 5. Then, a decision is made in step S160 as to whether or not the calculated wear index value is equal to or greater than the acceptable limit level 1 and less than the acceptable limit level 2.

If it is decided in step S160 that the calculated wear index value is equal to or greater than the acceptable limit level 1 and less than the acceptable limit level 2, consumable component replacement forecast processing is executed in step S170 and then the operation returns to step S130. The consumable component replacement forecast processing represents an example of the processing executed to indicate the consumable component replacement timing. In the consumable component replacement forecast processing, information indicating the consumable component replacement timing and information indicating the consumable component for which the replacement timing is indicated are brought up on display at the display means 240. In more specific terms, a message indicating that the particular consumable component needs to be replaced soon (e.g., "the electrode plate at the upper electrode needs to be replaced soon") may be displayed at the display means 240 constituted with, for instance, a display unit. Since the operator is able to keep track of consumable components that need to be replaced soon with ease in this manner, consumable component replacement can be performed with better efficiency.

In addition, if the wear index values calculated for a plurality of consumable components are each judged to be equal to or greater than the acceptable limit level 1 and less than the acceptable limit level 2, a decision may be made based upon, for instance, consumable component combination information (not shown) indicating predetermined consumable component combinations and stored in the storage means 290 as to whether or not there is a combination of at least two consumable components among the plurality of consumable components that can be replaced at the same time, and if such a consumable component combination is judged to exist, the combination information indicating the consumable components may be brought up on display at the display means 240 during the consumable component replacement forecast processing.

For instance, the electrode plate 144 constituting part of the upper electrode and the shield ring 150 disposed at the upper electrode are consumable components that can be replaced at once by opening the cover 104 and, accordingly, this consumable component combination can be stored as consumable component combination information. Then, if the electrode plate 144 and the shield ring 150 at the upper electrode are among the plurality of consumable components indicating wear index values equal to or greater than the acceptable limit level 1 and less than the acceptable limit level 2, the electrode plate 144 and the shield ring 150 are indicated at the display means 240 as a combination of consumable components that can be replaced at once. As described above, when a plurality of consumable components need to be replaced, any combination of consumable components that can be replaced at once can be ascertained based upon the consumable component combination information to result in a further improvement in the efficiency of the consumable component replacement.

In the specific example presented in FIG. 8, the wear index plot Y' reaches the acceptable limit level 1 when the focus ring 130 has been utilized over approximately 280 hours (RF discharge time) and, accordingly, the consumable component replacement forecast processing starts at the 280 hour point. The wear index plot Y''', on the other hand, reaches the acceptable limit level 1 later than the wear index plot Y' after approximately 390 hours of use (RF discharge time) and, accordingly, the consumable component replacement forecast processing starts at the 390 hour point in correspondence to the wear index plot Y'''.

If it is decided in step S160 that the calculated wear index value is not equal to or greater than the acceptable limit level 1 and less than the acceptable limit level 2, a decision is made in step S180 as to whether or not the calculated wear index value is equal to or greater than the acceptable limit level 2. If it is decided in step S180 that the calculated wear index value is not equal to or greater than the acceptable limit level 2, the operation returns to step S130, whereas if it is decided in step S180 that the calculated wear index value is equal to or greater than the acceptable limit level 2, consumable component replacement prompt processing is executed in step S190. The consumable component replacement prompt processing represents an example of processing executed to indicate the consumable component replacement timing. In the specific example presented in FIG. 8, the wear index plot Y' reaches the acceptable limit level 2 when the focus ring 130 has been utilized over approximately 340 hours (RF discharge time) and, accordingly, the consumable component replacement prompt processing starts at the 340-hour point. The wear index plot Y''', on the other hand, reaches the acceptable limit level 2 later than the wear index plot Y' after approximately 460 hours of use (RF discharge time) and, accordingly, the consumable component replacement prompt processing starts at the 460 hour point in correspondence to the wear index plot Y'''.

Figure 9:
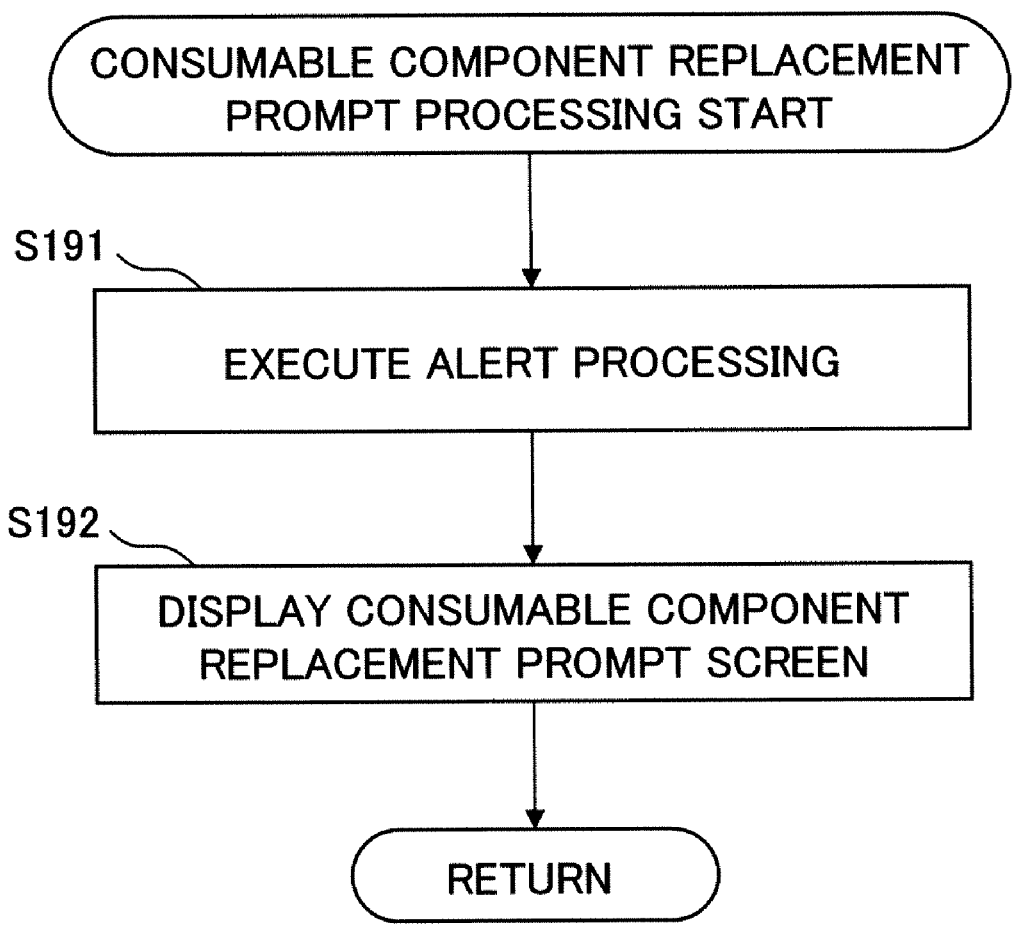
FIG. 9 presents a flowchart of a specific example of the consumable component replacement prompt processing executed in the embodiment.

The consumable component replacement prompt processing (step S190) is executed in a subroutine such as that shown in FIG. 9. First, alert processing is executed in step S191. The alert processing may be executed by driving the alerting means 260 such as an alarm. It is to be noted that this alert processing is executed if "active" is set in the execution selection data in the acceptable wear index limit information such as that shown in FIG. 5 but is not executed if "inactive" is set in the execution selection data.

Figure 10:
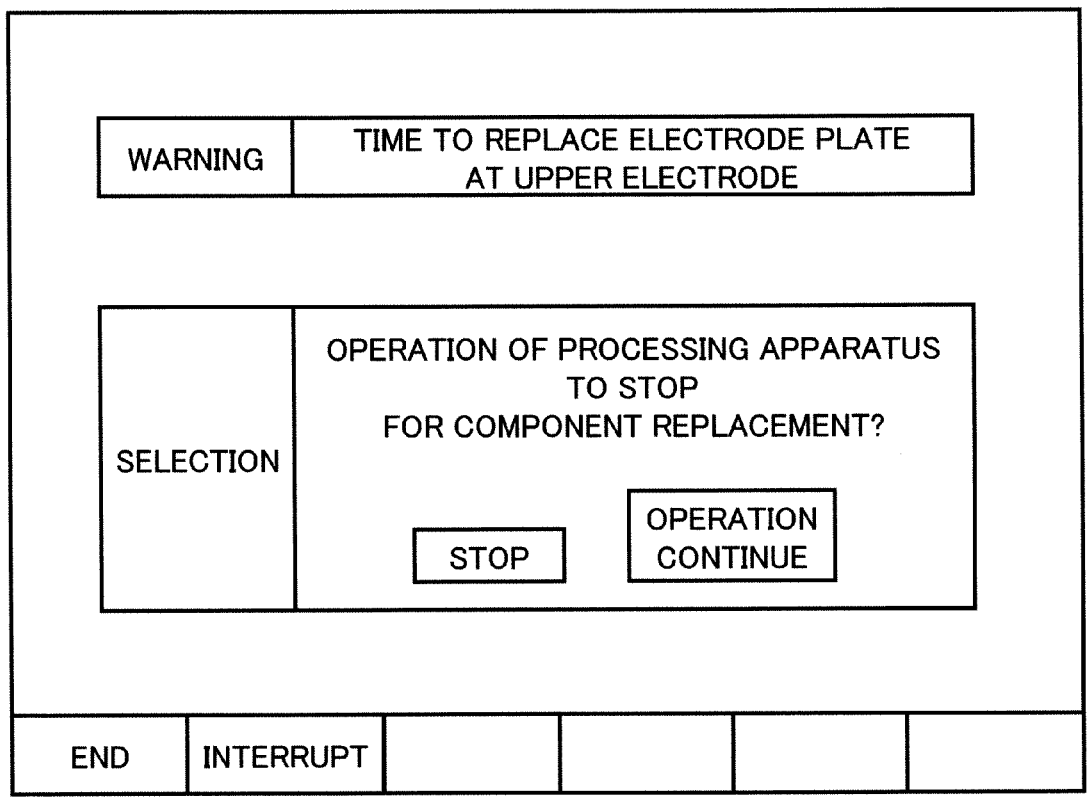
FIG. 10 presents a specific example that may be brought up as the consumable component replacement prompt screen in the embodiment.

Next, a consumable component replacement prompt screen is brought up on display at the display means 240 in step S192, before the operation returns to the main routine shown in FIG. 6. In the consumable component replacement prompt screen, a warning message indicating that a consumable component needs to be replaced and a selection message allowing the operator to choose whether or not to stop the operation of the substrate processing apparatus 100 for the consumable component replacement are displayed, as shown in FIG. 10. In the example presented in FIG. 10, the selection message includes an "operation stop" button and a "continue" button.

Next, in step S200 in the main routine in FIG. 6, a decision is made as to whether or not to stop the operation of the substrate processing apparatus 100. The decision as to whether or not to stop the operation of the substrate processing apparatus 100 is made based upon whether the "operation stop" option or the "continue" option in the message shown in FIG. 10 has been selected. If it is decided in step S200 that the operation of the substrate processing apparatus 100 is not to be stopped, i.e., if the "continue" option has been selected, the operation returns to step S130 without stopping the operation of the substrate processing apparatus 100.

If, on the other hand, it is decided in step S200 that the operation of the substrate processing apparatus 100 is to stop, i.e., if the "operation stop" option has been selected, the operation of the substrate processing apparatus 100 is interrupted in step S210 and the sequence of the consumable component management processing ends. It is to be noted that once the consumable component is replaced and the operation of the substrate processing apparatus 100 resumes, the execution of the consumable component management processing in FIG. 6 starts in step S110.

As described above, the substrate processing apparatus achieved in the embodiment executes the consumable component management processing through which the wear index value (an estimated value indicating the wear extent) is calculated based upon the utilization time lengths and the wear coefficients corresponding to the individual types of processing and thus, the wear index value for the specific consumable component is determined in correspondence to the execution ratios of the individual types of processing. As a result, the extent of wear of the consumable component can be estimated accurately even when a plurality of types of processing are executed under different processing conditions and the execution ratios of the individual types of processing do not remain constant, as well as when a single type of processing is executed continuously inside the processing chamber 102. Consequently, the optimal consumable component replacement timing can be indicated. In addition, since the consumable component management processing is executed while the substrate processing apparatus 100 is engaged in operation, the consumable component replacement timing can be indicated in a timely manner for the substrate processing apparatus 100 in the operating state.

(Another Structural Example for the Substrate Processing Apparatus)

Figure 11:
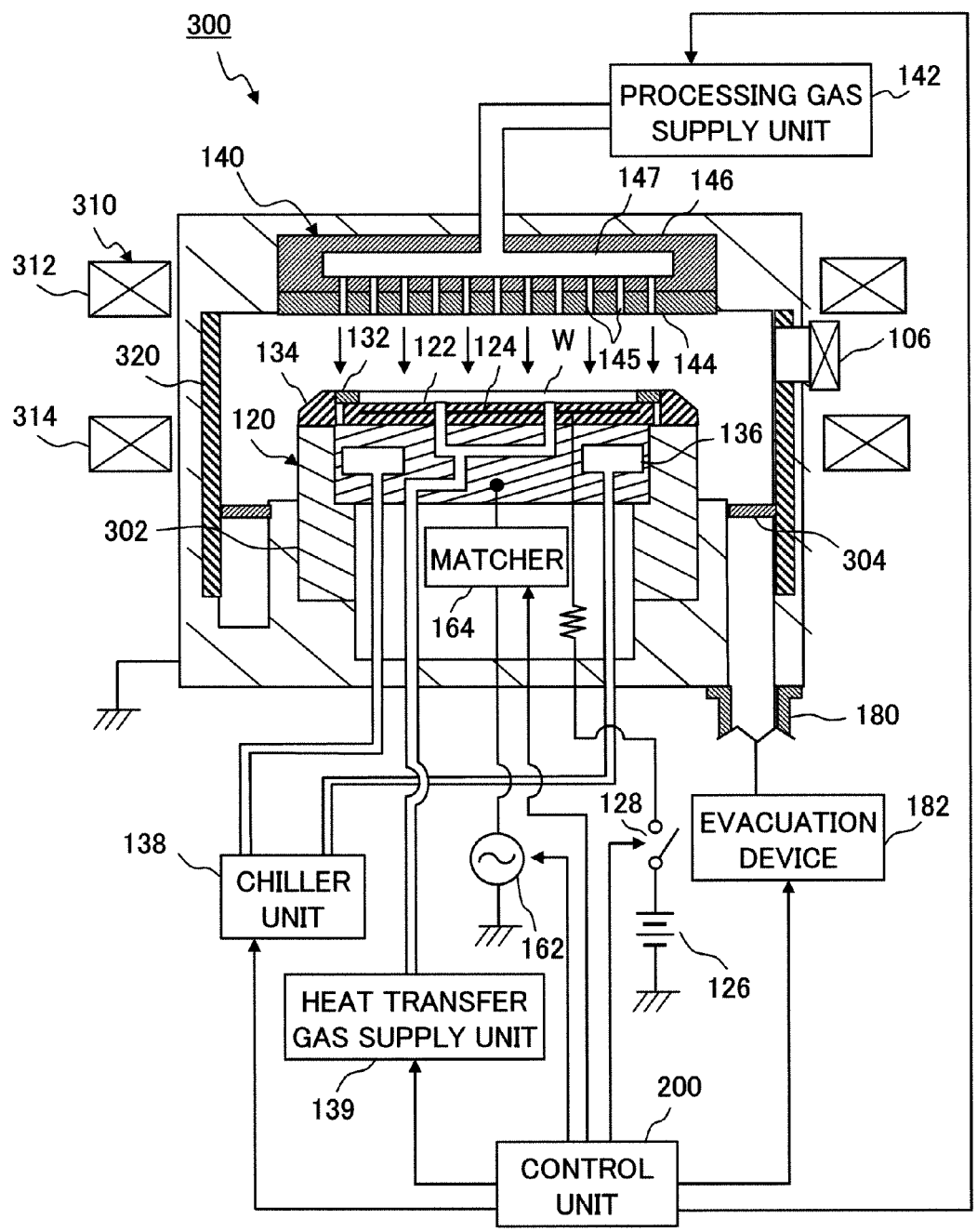
FIG. 11 is a sectional view presenting another structural example that may be adopted in the substrate processing apparatus in the embodiment.

Next, another structural example that may be adopted in the substrate processing apparatus in the embodiment is explained in reference to a drawing. FIG. 11 is a sectional view showing another structural example that may be adopted in the substrate processing apparatus in the embodiment. While high-frequency power is applied to both the upper electrode 140 and the lower electrode 120 in the substrate processing apparatus 100 shown in FIG. 1, high-frequency power is applied to the lower electrode 120 alone in a substrate processing apparatus 300 shown in FIG. 11.

As shown in FIG. 11, the lower electrode 120 in the substrate processing apparatus 300 is fixed to the processing chamber 102 via a holding unit 302. In addition, an annular baffle plate 304 is mounted at the entrance to or inside a discharge passage extending within the processing chamber 102. In addition, magnets 310 are disposed coaxially or in a ring shape around the processing chamber 102. The magnets 310 include an upper magnet 312 and a lower magnet 314 disposed one above the other. The intensity of the magnetic field generated with such magnets can be set as one of the processing conditions. Since the extents of wear of consumable components are also affected by the level of the magnetic field intensity, it is desirable that processing executed with the magnetic field intensity adjusted by an extent greater than a predetermined extent be designated as a different type of processing for purposes of wear index calculation.

High-frequency power with the frequency of, for instance, 60 MHz is applied from the high-frequency power source 162 to the lower electrode 120 and, as a result, a vertical RF field is formed in the space between the upper electrode 140 and the lower electrode 120 in the substrate processing apparatus 300. As such high-frequency power is discharged, high-density plasma is generated near the surface of the lower electrode 120, and processing such as etching or film formation can be executed on the wafer W placed on the lower electrode 120 with the plasma thus generated.

A shield plate 320 is mounted at the inner circumferential surface of the processing chamber 102 of the substrate processing apparatus 300 so as to protect the inner circumferential surface. This shield plate 320 protects the inner circumferential surface of the processing chamber 102 from ions of the plasma generated inside the processing chamber 102 and prevents plasma byproducts (i.e., deposits) from settling on the inner circumferential surface of the processing chamber 102. Since the shield plate 320 is constituted of the same material as that used to constitute, for instance, the processing chamber 102 (e.g., anodized aluminum), its surface becomes etched as plasma processing is executed inside the processing chamber 102. Accordingly, the replacement timing of the shield plate 320, which is a consumable component requiring replacement, too, may be managed through component management processing achieved in the embodiment.

(Substrate Processing System Achieved in the Second Embodiment)

Next, the second embodiment achieved by adopting the processing system according to the present invention in a substrate processing system in which processing target substrates are processed, is explained in reference to drawings.

Figure 12:
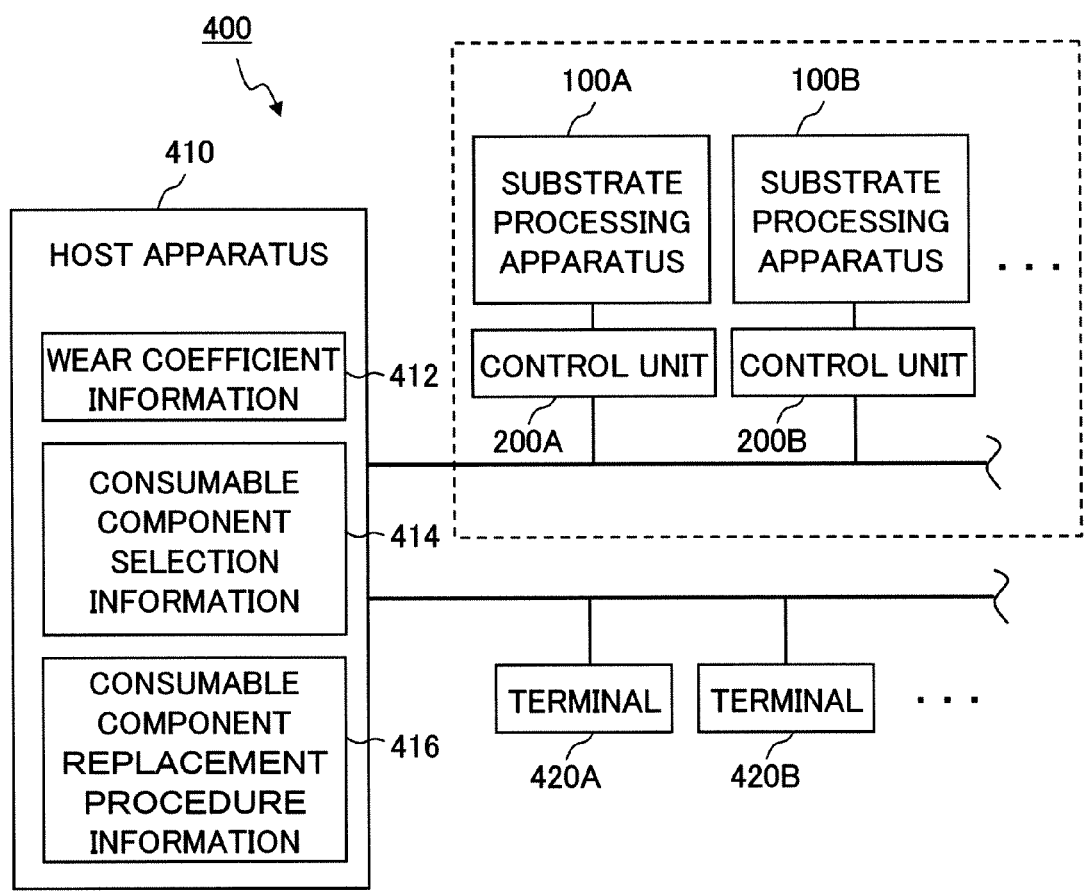
FIG. 12 is a block diagram presenting a structural example that may be adopted in the substrate processing system achieved in a second embodiment of the present invention.

FIG. 12 is a block diagram showing a structural example that may be adopted in the substrate processing system in the embodiment. A substrate processing system 400 includes a plurality of substrate processing apparatuses 100A, 100B, connected to an external apparatus such as a host apparatus 410 via corresponding control units 200A, 200B, . . . as shown in FIG. 12. The host apparatus 410 and the individual control units 200A, 200B, . . . are allowed to exchange information (data) via communication means or the like each provided in correspondence to one of the control units.

A plurality of terminals 420A, 420B, . . . are connected to the host apparatus 410. The terminals 420A, 420B, . . . each include a display means, an input/output means and the like so as to input/output data to/from the host apparatus 410 and display various types of data stored in the host apparatus 410. It is to be noted that since the individual substrate processing apparatuses 100A, 100B, . . . assume a structure similar to that of the substrate processing apparatus 100 having been described in reference to FIG. 1, a detailed explanation is not provided.

In the substrate processing system 400 achieved in the embodiment, the wear coefficient information needed in the consumable component wear index calculation is stored in the host apparatus 410 instead of in the control units 200A, 200B, . . . at the individual substrate processing apparatuses 100A, 100B, . . . . Namely, wear coefficient information 412 for the substrate processing apparatuses 100A, 100B, . . . is stored in the host apparatus 410. As the wear coefficient information 412, the wear coefficient information 294 such as that shown in FIG. 4 is stored in correspondence to each of the substrate processing apparatuses 100A, 100B, . . . . Thus, the control units 200A, 200B, . . . of the individual substrate processing apparatuses 100A, 100B, . . . in the substrate processing system 400 are able to take in the wear coefficients indicated in the wear coefficient information 294 stored in the host apparatus 410 as necessary when they calculate consumable component wear index values. Since the control units 200A, 200B, . . . do not need to store therein the wear coefficient information, the storage capacity of the control units 200A, 200B, . . . for storing information needed when executing processing therein can be reduced, which, in turn, reduces the onus placed on them.

It is to be noted that as long as the individual substrate processing apparatuses 100A, 100B, . . . assume structures identical to one another, their wear coefficient information, too, will be identical, and under such circumstances, it is not strictly necessary to provide the wear coefficient information in correspondence to each of the substrate processing apparatuses 100A, 100B, . . . Rather, it will suffice to store the wear coefficient information for a single substrate processing apparatus as common wear coefficient information. However, if the substrate processing apparatuses 100A, 100B, . . . assume structures different from one another, different sets of wear coefficient information need to be provided each in correspondence to one of the substrate processing apparatuses 100A, 100B, . . .

The host apparatus 410 also holds consumable component selection information 414 to be used to select an optimal candidate consumable component to be used as a replacement and consumable component replacement procedure information indicating a replacement procedure for the consumable component to be used as a replacement. The consumable component selection information 414 is constituted with a data table such as that shown in FIG. 13 containing data indicating consumable component types, manufacturers, model numbers, prices, selection criteria and the like. The data indicating the consumable component types, manufacturers, model numbers and prices constitute consumable component information on consumable components that may be used as replacements. A plurality of consumable components that may be used as replacements are stored in correspondence to each consumable component type. In addition, the selection criteria data are used to set selection criterion information needed when selecting a candidate consumable component to be used as a replacement from the plurality of consumable components indicated in the consumable component selection information 414. As a selection criterion, a specific category of data included in the consumable component information can be set in correspondence to each consumable component type so as to select an optimal candidate consumable component to be used as a replacement based upon the selection criterion.

In addition, the consumable component replacement procedure information 416 is constituted with a data table such as that shown in FIG. 14, which includes data indicating the consumable component types and the replacement procedures. The replacement procedures each corresponding to a specific consumable component type are stored as the consumable component replacement procedure information 416. It is to be noted that replacement procedures each corresponding to a specific consumable component that can be selected as a replacement based upon the consumable component selection information 414 shown in FIG. 13 may be stored as the consumable component replacement procedure information 416, instead.

The control units 200A, 200B, . . . in the individual substrate processing apparatuses 100A, 100B, . . . each execute consumable component management processing similar to that shown in FIG. 6. In the substrate processing system 400 achieved in the embodiment, the wear index calculation processing (step S140) in FIG. 6 (step S140) is executed to calculate the wear index values for consumable components through a subroutine such as that shown in FIG. 15 instead of that shown in FIG. 7.

Figure 15:
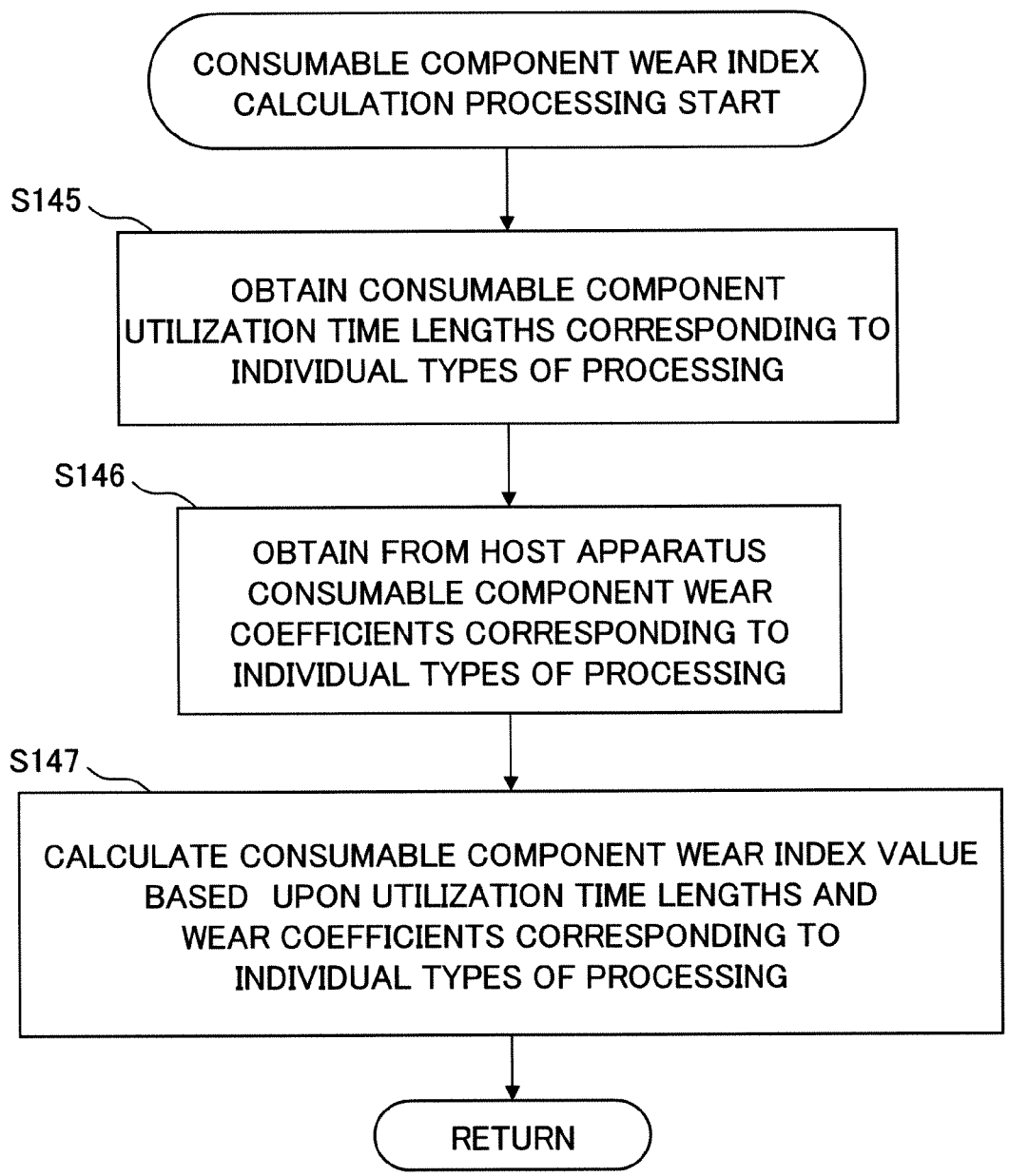
FIG. 15 presents a flowchart of a specific example of the consumable component wear index calculation processing in the embodiment.

In the subroutine shown in FIG. 15, the lengths of consumable component utilization time are obtained in correspondence to the individual types of processing in step S145. This processing is similar to that executed in step S141 in FIG. 7. Then, in step S146, the consumable component wear coefficients corresponding to the individual types of processing are obtained from the wear coefficient information 412 stored in the host apparatus 410. Next, in step S147, the wear index value is calculated for the consumable component based upon the utilization time lengths and the wear coefficients corresponding to the individual types of processing. This processing is similar to that executed in step S143 in FIG. 7.

As described above, the wear index value is calculated for the consumable component by taking in the wear coefficients indicated in the wear coefficient information 412 stored in the host apparatus 410 in the substrate processing system 400. Thus, the control units 200A, 200B, . . . in the substrate processing apparatuses 100A, 100b, . . . do not need to store the wear coefficient information.

Figure 16:
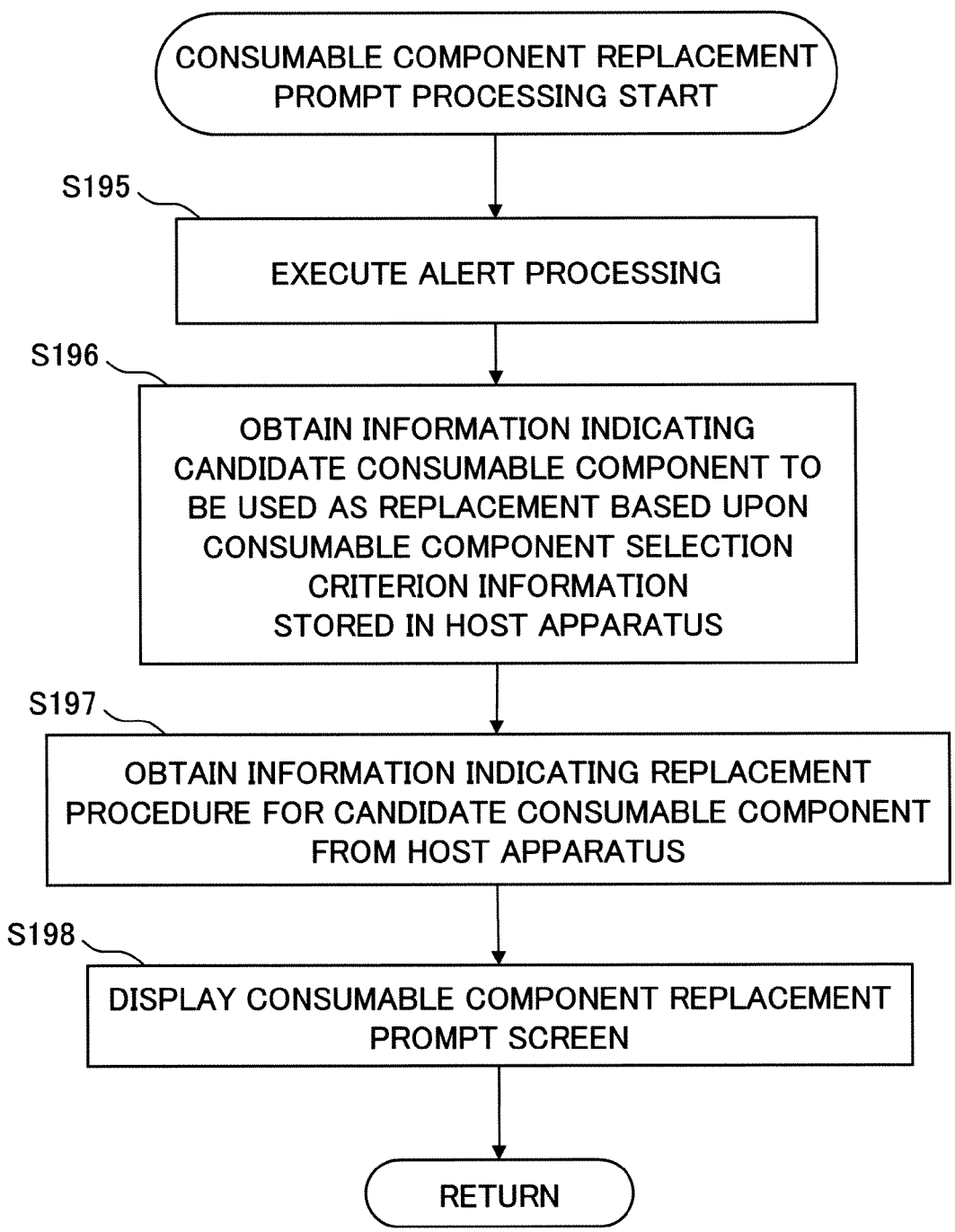
FIG. 16 presents a flowchart of a specific example of the consumable component replacement prompt processing executed in the embodiment.

In addition, in the substrate processing system 400 achieved in the embodiment, the consumable component replacement prompt processing in FIG. 6 (step S190) is executed through a subroutine such as that shown in FIG. 16 instead of the subroutine shown in FIG. 9. In the subroutine shown in FIG. 16, alert processing is executed in step S195. This processing is similar to that executed in step S191 in FIG. 9.

Next, in step S196, a specific candidate consumable component to be used as a replacement is ascertained based upon the consumable component selection criterion information stored in the host apparatus 410. In more specific terms, upon receiving a candidate consumable component request from the control unit 200A, 200B, . . . , the host apparatus 410 selects a candidate consumable component to be used as a replacement based upon a specific selection criterion from the consumable components indicated in the consumable component selection information 414 shown in FIG. 13.

At this time, if "price" is used as the selection criterion, the least expensive consumable component among the plurality of consumable components is selected. If, on the other hand, "manufacturer" is specified as the selection criterion, the consumable component manufactured by a specific manufacturer among the plurality of consumable components is selected. The host apparatus 410 then transmits information indicating the candidate consumable component selected based upon the selection criterion information to the control unit 200A, 200B, . . .

It is to be noted that when transmitting the candidate consumable component request to the host apparatus 410, the control unit 200A, 200B, . . . may also transmit selection criterion information. In such a case, the host apparatus 410 selects a candidate consumable component based upon the selection criterion information received from the control unit 200A, 200B, . . . .

Next, the replacement procedure for the selected candidate consumable component is obtained from the host apparatus 410 in step S197. More specifically, upon receiving a request for the replacement procedure information corresponding to the candidate consumable component from the control unit 200A, 200B, . . . , the host apparatus 410 selects specific replacement procedure information corresponding to the candidate consumable component in the consumable component replacement procedure information 416 shown in FIG. 14 and transmits the selected replacement procedure information to the control unit 200A, 200B, . . . .

Figure 17:
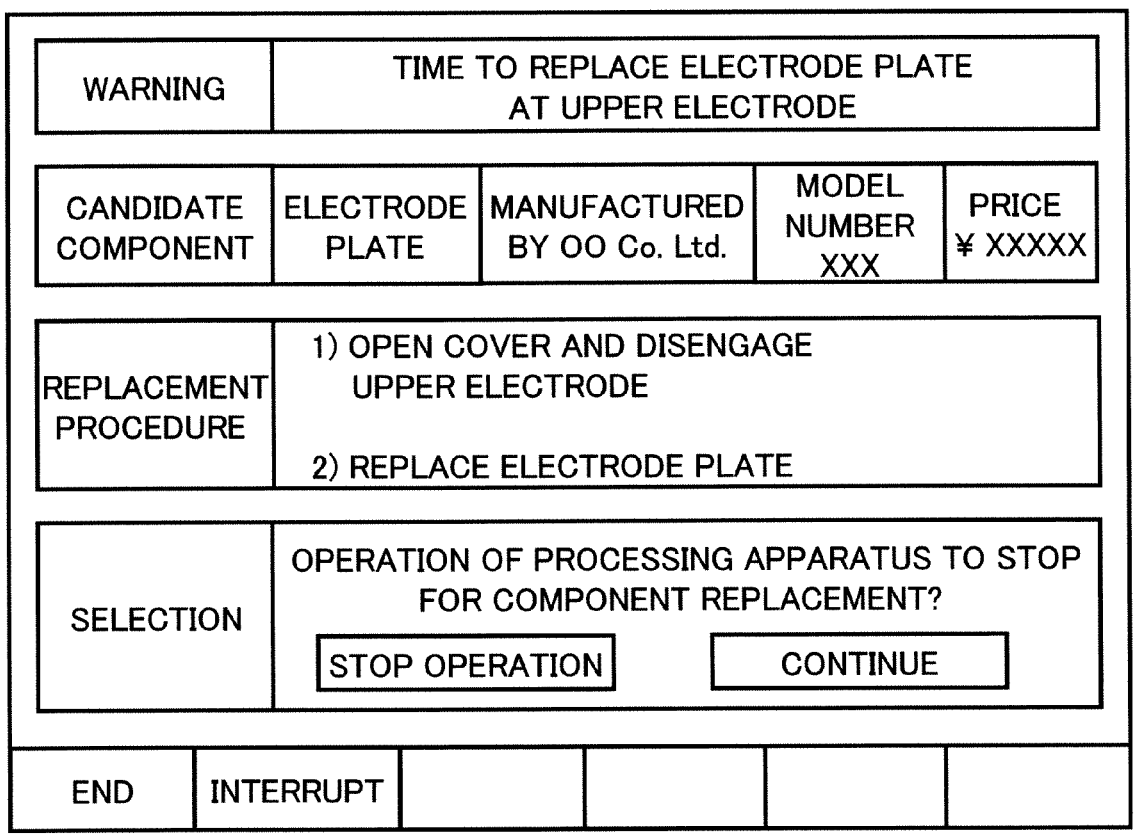
FIG. 17 presents a specific example that may be brought up as the consumable component replacement prompt screen in the embodiment.

Next, in step S198, a consumable component replacement prompt screen is brought up on display at the display means 240 before the operation returns to the main routine shown in FIG. 6. The consumable component replacement prompt screen brought up on display in this step may include candidate component information indicating the candidate consumable component to be used as the replacement and the replacement procedure information corresponding to the candidate consumable component, in addition to a warning message indicating the consumable component replacement timing and a selection inquiry allowing the operator to choose whether or not to interrupt the operation of the substrate processing apparatus 100 for purposes of consumable component replacement, as shown in FIG. 17. The processing allows the consumable component selection and the replacement to be executed with ease even when the operator does not have expert knowledge of consumable component replacement operations.

It is to be noted that the wear coefficient information 412, the consumable component selection information 414 and the consumable component replacement procedure information 416 described above may be stored in a storage means such as a hard disk or a memory installed in the host apparatus 410.

In the substrate processing system achieved in the second embodiment described above, the plurality of substrate processing apparatuses 100A, 100B . . . are connected to the host apparatus 410 respectively via the control units 200A, 200B, . . . , the wear coefficient information to be used for the consumable component wear index calculation is stored in the host apparatus 410 and the individual control units 200A, 200B, . . . obtain the wear coefficients from the host apparatus 410 whenever necessary. Since this eliminates the need for the control units 200A, 200B, . . . to store the wear coefficient information, the control units 200A, 200B, . . . are only required to assure a small storage capacity for holding information needed for processing execution and thus, the onus placed on the control units is reduced.

It is to be noted that while an explanation is given above in reference to the embodiment on an example in which the external apparatus in the processing system is constituted with the host apparatus 410, the present invention is not limited to this example and the external apparatus may instead be an external processing apparatus, a server or the like.

In addition, while an explanation is given above in reference to the embodiment on an example in which the consumable component selection information 414 and the consumable component replacement procedure information 416 are stored in the storage means at the host apparatus 410, the present invention is not limited to this example and the consumable component selection information and the consumable component replacement procedure information may instead be stored in the storage means 290 at the control units 200A, 200B, . . . of the individual substrate processing apparatuses 100A, 100B, . . . so as to obtain the consumable component selection information 414 and the consumable component replacement procedure information 416 relevant to the individual substrate processing apparatuses 100A, 100B, . . . from the respective storage means 290. In such a case, the candidate consumable component selection processing described earlier, too, may be executed by the individual control units 200A, 200B, . . .

Furthermore, it will be obvious that the present invention may be implemented by distributing a medium such as a storage medium having stored therein a software program enabling the functions achieved in the first embodiment or the second embodiment to a system or an apparatus and allowing a computer (or a CPU or an MPU) in the system or the apparatus to read out and execute the program stored in the medium such as a storage medium.

In such a case, the program itself read out from the medium such as a storage medium embodies the functions of the embodiments described above and the medium such as a storage medium having the program stored therein embodies the present invention. The medium such as a storage medium through which the program is provided may be, for instance, a floppy (registered trademark) disk, a hard disk, an optical disk, a magneto-optical disk, a CD-ROM, a CD-R, a CD-RW, a DVD-ROM, a DVD-RAM, a DVD-RW, a DVD+RW, magnetic tape, a nonvolatile memory card, or a ROM. Alternatively, such a program may be obtained through a download via a network.

It is to be noted that the scope of the present invention includes an application in which an OS or the like operating on the computer executes the actual processing in part or in whole in response to the instructions in the program read out by the computer and the functions of the embodiments are achieved through the processing thus executed, as well as an application in which the functions of the embodiment are achieved as the computer executes the program it has read out.

The scope of the present invention further includes an application in which the program read out from the medium such as a storage medium is first written into a memory in a function expansion board loaded in the computer or a function expansion unit connected to the computer, a CPU or the like in the function expansion board or the function expansion unit executes the actual processing in part or in whole in response to the instructions in the program and the functions of the embodiments described above are achieved through the processing.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the consumable component management processing is executed as specific functions of the control unit 200 which controls the various units constituting the substrate processing apparatus 100 or 300 in the explanation of each embodiment, the present invention is not limited to this example and the consumable component management processing may instead be executed by a control unit such as a data collection/analysis unit, which is provided independently of the control unit 200 for controlling the various units of the substrate processing apparatus 100 or 300.

In addition, while the processing apparatus according to the present invention is embodied as a substrate processing apparatus such as a plasma processing apparatus in each embodiment described above, the present invention is not limited to this example and it may be adopted in any of various types of processing apparatuses that include consumable components disposed therein and are capable of executing a plurality of types of processing under varying processing conditions.

INDUSTRIAL APPLICABILITY

The present invention may be adopted in a processing apparatus that executes management of consumable components disposed inside a processing chamber, a consumable component management method for a processing apparatus, a processing system and a consumable component management method for a processing system.

What is claimed is:

1. A processing apparatus capable of executing a plurality of types of processing under different processing conditions inside a processing chamber in which consumable components are disposed, comprising:
a measuring means for measuring a utilization status of a consumable component in correspondence to each type of processing executed in said processing chamber;
a storage means for storing wear coefficient information indicating wear coefficients each indicating a wear extent change rate determined in advance for said consumable component in correspondence to a specific type of processing among the plurality of types of processing executed in said processing chamber; and
a control unit that obtains utilization statuses corresponding to the individual types of processing, having been measured by said measuring means, obtains said wear coefficients corresponding to the individual types of processing indicated in said wear coefficients information stored in said storage means, calculates a wear index value for said consumable component based upon said utilization statuses corresponding to the individual types of processing and the wear coefficient corresponding to the individual types of processing and executes management processing to manage said consumable component based upon said calculated wear index value.

2. A processing apparatus according to claim 1, wherein:
said utilization status of said consumable component is a utilization frequency indicating the number of times said consumable component has been utilized; and
said control unit calculates said wear index value for said consumable component as a sum of products each obtained by the utilization frequency corresponding to a given type of processing by the wear coefficient corresponding to the same type of processing.

3. A processing apparatus according to claim 1, wherein:
said measuring means is constituted with counters each disposed in correspondence to one of the individual types of processing.

4. A processing apparatus according to claim 1, wherein:
said management processing executed for said consumable component includes:
processing through which a decision is made as to whether or not said consumable component has been replaced and if said consumable component is determined to have been replaced, said utilization statuses having been measured for said consumable component by said measuring means are reset.

5. A processing apparatus according to claim 1, wherein:
said processing executed in said processing chamber includes processing executed on a processing target substrate.

6. A processing apparatus according to claim 1, wherein:
said management processing, which includes calculation of said wear index value of said consumable component is executed while said processing apparatus is engaged in operation.

7. A processing apparatus according to claim 1, wherein:
said utilization status of said consumable component is a utilization time indicating the length of time over which said consumable component has been utilized; and
said control unit calculates said wear index value for said consumable component as a sum of products each obtained by multiplying the utilization time corresponding to a given type of processing by the wear coefficient corresponding to the same type of processing.

8. A processing apparatus according to claim 7, wherein:
said utilization time for said consumable component is measured by said measuring means is a length of time over which high-frequency power is discharged to be applied to an electrode plate disposed inside said processing chamber.

9. A processing apparatus according to claim 1, wherein:
said management processing executed for said consumable component includes processing through which said wear index value calculated for said consumable component is compared with a predetermined acceptable limit value for consumable component replacement timing and indicating when said wear index value calculated for said consumable component becomes equal to or greater than said acceptable limit value.

10. A processing apparatus according to claim 9, wherein:
said processing for indicating said consumable component replacement timing includes:
processing through which information indicating said consumable component replacement timing and information on said consumable component for which the replacement timing is indicated are displayed at a display means; and
processing through which, if there are a plurality of consumable components, with consumable component wear index values thereof having been calculated equal to or greater than said acceptable limit value, a decision is made based upon consumable component combination information set in advance as to whether or not there is a combination of at least two consumable components that can be replaced at once among the plurality of consumable components and if such a combination of consumable components is determined to exist, information indicating said consumable component combination is displayed at said display means.

11. A consumable component management method adopted in a processing apparatus capable of executing a plurality of types of processing under different processing conditions inside a processing chamber in which consumable components are disposed, comprising:
a step in which a measuring means is engaged to measure a utilization status of a consumable component in correspondence to each type of processing executed in said processing chamber; and
a step in which utilization statuses corresponding to the individual types of processing, having been measured by said measuring means, are obtained, wear coefficients each indicating a wear extent change rate determined in advance for said consumable component in correspondence to a specific type of processing among the plurality of types of processing indicated in wear coefficient information for said consumable component stored in a storage means, are obtained, a wear index value is calculated for said consumable component based upon said utilization statuses corresponding to the individual types of processing and said wear coefficients corresponding to the individual types of processing and said consumable component is managed based upon said calculated wear index value.

12. A consumable component management method adopted in a processing apparatus according to claim 11, wherein:
said utilization status of said consumable component is a utilization frequency indicating the number of times said consumable component has been utilized; and
in said step for calculating said wear index value for said consumable component, said wear index value is calculated for said consumable component as a sum of products each obtained by multiplying the utilization frequency corresponding to a given type of processing by the wear coefficient corresponding to the same type of processing.

13. A consumable component management method adopted in a processing apparatus according to claim 11, wherein:
said measuring means is constituted with counters each disposed in correspondence to one of the individual types of processing.

14. A consumable component management method adopted in a processing apparatus according to claim 11, wherein:
said step executed to manage said consumable component includes:
a step in which a decision is made as to whether or not said consumable component has been replaced; and
a step in which said utilization statuses for said consumable component having been measured by said measuring means are reset if said consumable component is judged to have been replaced.

15. A consumable component management method adopted in a processing apparatus according to claim 11, wherein:
said processing executed in said processing chamber includes processing executed on a processing target substrate.

16. A consumable component management method adopted in a processing apparatus according to claim 11, wherein:
said step, which includes calculation of said wear index value of said consumable component is executed for said consumable component while said processing apparatus is engaged in operation.

17. A consumable component management method adopted in a processing apparatus according to claim 11, wherein:
said utilization status of said consumable component is a utilization time indicating the length of time over which said consumable component has been utilized; and
in said step for calculating said wear index value for consumable component, said wear index value is calculated for said consumable component as a sum of products each obtained by multiplying the utilization time corresponding to a given type of processing by the wear coefficient corresponding to the same type of processing.

18. A consumable component management method adopted in a processing apparatus according to claim 17, wherein:
said utilization time measured for said consumable component by said measuring means is a length of time over which high-frequency power is discharged to be applied to an electrode plate disposed inside said processing chamber.

19. A consumable component management method adopted in a processing apparatus according to claim 11, wherein:
said step executed to manage said consumable component includes a step in which said wear index value calculated for said consumable component is compared with a predetermined acceptable limit value and replacement timing for said consumable component is indicated once said wear index value calculated for said consumable component becomes equal to or greater than said acceptable limit value.

20. A consumable component management method adopted in a processing apparatus according to claim 19, wherein:
said step executed to indicate replacement timing for said consumable component includes:
a step in which information indicating said consumable component replacement timing and information on said consumable component for which the replacement timing is indicated are displayed at a display means; and
a step in which, if there are a plurality of consumable components, with consumable component wear index values thereof having been calculated equal to or greater than said acceptable limit value, a decision is made based upon consumable component combination information set in advance as to whether or not there is a combination of at least two consumable components that can be replaced at once among the plurality of consumable components and if such a combination of consumable components is determined to exist, information indicating said consumable component combination is displayed at said display means.

21. A processing system that includes at least one processing apparatus capable of exchanging information with an external apparatus, wherein:
said processing apparatus is capable of executing a plurality of types of processing under different processing conditions within a processing chamber having consumable components disposed therein; and comprises:
a measuring means for measuring a utilization status of a consumable component in correspondence to each type of processing executed in said processing chamber; and
a control unit that obtains utilization statuses corresponding to the individual types of processing, having been measured by said measuring means, obtains wear coefficients each indicating a wear extent change rate determined in advance for the consumable component in correspondence to a specific type of processing among the plurality of types of processing from said external apparatus, calculates a wear index value for said consumable component based upon said utilization statuses corresponding to the individual types of processing and said wear coefficients corresponding to the individual types of processing and executes management processing to manage said consumable component based upon said calculated wear index value.

22. A processing system according to claim 21, wherein:
said utilization status of said consumable component is a utilization time indicating the length of time over which said consumable component has been utilized; and
said control unit calculates said wear index value for said consumable component as a sum of products each obtained by multiplying the utilization time corresponding to a given type of processing by the wear coefficient corresponding to the same type of processing.

23. A processing system according to claim 21, wherein:
said utilization status of said consumable component is a utilization frequency indicating the number of times said consumable component has been utilized; and
said control unit calculates said wear index value for said consumable component as a sum of products each obtained by the utilization frequency corresponding to a given type of processing by the wear coefficient corresponding to the same type of processing.

24. A processing system according to claim 21, wherein:
said management processing executed for said consumable component includes processing through which said wear index value calculated for said consumable component is compared with a predetermined acceptable limit value for consumable component replacement timing and indicating when said wear index value calculated for said consumable component becomes equal to or greater than said acceptable limit value.

25. A processing system according to claim 24, wherein:
said processing for indicating replacement timing for said consumable component includes:
processing through which information indicating said consumable component replacement timing and information on said consumable component for which the replacement timing is indicated are displayed at a display means; and
processing through which information on a candidate consumable component, selected based upon a preset selection criterion to be used as a consumable component replacement, is obtained from said external apparatus and the candidate consumable component information thus obtained is brought up on display at said display means.

26. A processing system according to claim 24, wherein:
said processing for indicating said consumable component replacement timing includes:
processing through which replacement procedure information indicating a procedure for consumable component replacement is obtained from said external apparatus and the replacement procedure information thus obtained is brought up on display at a display means.

27. A consumable component management method adopted in a processing system that includes at least one processing apparatus capable of exchanging information with an external apparatus and executing a plurality of types of processing under different processing conditions inside a processing chamber having consumable components disposed therein, comprising:
a step in which a measuring means is engaged to measure a utilization status of a consumable component in correspondence to each type of processing executed in said processing chamber; and
a step in which utilization statuses corresponding to the individual types of processing, having been measured by said measuring means, are obtained, wear coefficients each indicating a wear extent change rate determined in advance for said consumable component in correspondence to a specific type of processing among the plurality of types of processing, indicated in wear coefficient information for said consumable component stored in a storage means, are obtained, a wear index value is calculated for said consumable component based upon said utilization statuses corresponding to the individual types of processing and said wear coefficients corresponding to the individual types of processing and said consumable component is managed based upon said calculated wear index value.

28. A consumable component management method adopted in a processing system according to claim 27, wherein:
said utilization status of said consumable component is a utilization time indicating the length of time over which said consumable component has been utilized; and
in said step for calculating said wear index value for consumable component, said wear index value is calculated for said consumable component as a sum of products each obtained by multiplying the utilization time corresponding to a given type of processing by the wear coefficient corresponding to the same type of processing.

29. A consumable component management method adopted in a processing system according to claim 27, wherein:
said utilization status of said consumable component is a utilization frequency indicating the number of times said consumable component has been utilized; and
in said step for calculating said wear index value for said consumable component, said wear index value is calculated for said consumable component as a sum of products each obtained by multiplying the utilization frequency corresponding to a given type of processing by the wear coefficient corresponding to the same type of processing.

30. A consumable component management method adopted in a processing system according to claim 27, wherein:
said step executed to manage said consumable component includes a step in which said wear index value calculated for said consumable component is compared with a predetermined acceptable limit value and replacement timing for said consumable component is indicated once said wear index value calculated for said consumable component becomes equal to or greater than said acceptable limit value.

31. A consumable component management method adopted in a processing system according to claim 30, wherein:
said processing for indicating replacement timing for said consumable component includes:
processing through which information indicating said consumable component replacement timing and information on said consumable component for which the replacement timing is indicated are displayed at a display means; and
processing through which information on a candidate consumable component, selected based upon a preset selection criterion to be used as a consumable component replacement, is obtained from said external apparatus and the candidate consumable component information thus obtained is brought up on display at said display means.

32. A consumable component management method adopted in said processing system according to claim 30, wherein:
said processing for indicating said consumable component replacement timing includes:
processing through which replacement procedure information indicating a procedure for consumable component replacement is obtained from said external apparatus and the replacement procedure information thus obtained is brought up on display at a display means.

* * * * *